(12) United States Patent
Guler et al.

(10) Patent No.: US 12,453,160 B2
(45) Date of Patent: Oct. 21, 2025

(54) DEEP ETCH PROCESSING FOR TRANSISTORS HAVING VARYING PITCH

(71) Applicant: Intel Corporation, Santa Clara, CA (US)

(72) Inventors: Leonard P. Guler, Hillsboro, OR (US); Mohammad Hasan, Aloha, OR (US); Tahir Ghani, Portland, OR (US); Charles H. Wallace, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 17/687,463

(22) Filed: Mar. 4, 2022

(65) Prior Publication Data

US 2023/0282718 A1    Sep. 7, 2023

(51) Int. Cl.
| | |
|---|---|
| H10D 64/23 | (2025.01) |
| B82Y 10/00 | (2011.01) |
| H10D 30/01 | (2025.01) |
| H10D 30/43 | (2025.01) |
| H10D 30/67 | (2025.01) |
| H10D 62/10 | (2025.01) |
| H10D 62/13 | (2025.01) |
| H10D 62/17 | (2025.01) |
| H10D 64/01 | (2025.01) |
| H10D 84/01 | (2025.01) |
| H10D 84/03 | (2025.01) |
| H10D 84/83 | (2025.01) |

(52) U.S. Cl.
CPC ......... *H10D 64/258* (2025.01); *H10D 30/014* (2025.01); *H10D 30/6735* (2025.01); *H10D 62/121* (2025.01); *H10D 62/151* (2025.01); *H10D 64/01* (2025.01); *H10D 84/013* (2025.01); *H10D 84/038* (2025.01); *H10D 84/83* (2025.01)

(58) Field of Classification Search
CPC .............. H10D 64/258; H10D 30/014; H10D 30/6735; H10D 62/121; H10D 62/151; H10D 64/01; H10D 84/013; H10D 84/038; H10D 84/83; H10D 30/6757; H10D 30/43; H10D 62/364; H10D 64/017; H10D 84/0133; B82Y 10/00
See application file for complete search history.

(56) References Cited

U.S. PATENT DOCUMENTS

2018/0358268 A1* 12/2018 Bao ................. H10D 84/038

* cited by examiner

*Primary Examiner* — Sonya McCall-Shepard
(74) *Attorney, Agent, or Firm* — Finch & Maloney PLLC

(57) ABSTRACT

Techniques are provided herein to form semiconductor devices having different pitches, yet maintaining a substantially similar depth to the diffusion regions between the semiconductor regions. In an example, a row of semiconductor devices having semiconductor regions extending in a first direction can include some devices having a diffusion region with a first width in the first direction and some devices having a diffusion region with a second width in the first direction, where the second width is different from the first width. The depths of the diffusion regions having both the first and second widths may be substantially similar (e.g., within 2 nm or less of one another). In some examples, the bottom surface of at least one of the wider diffusion regions has a step profile.

20 Claims, 15 Drawing Sheets

US 12,453,160 B2

DEEP ETCH PROCESSING FOR TRANSISTORS HAVING VARYING PITCH

FIELD OF THE DISCLOSURE

The present disclosure relates to integrated circuits, and more particularly, to transistor devices having varying pitch.

BACKGROUND

As integrated circuits continue to scale downward in size, a number of challenges arise. For instance, reducing the size of memory and logic cells is becoming increasingly more difficult. Performing certain etching processes across such a large array of devices in an integrated circuit can have unintended consequences. If some semiconductor devices are unintentionally formed differently than others (e.g., with differing dimensions of certain features), the circuit may perform differently than intended or otherwise not function properly. Accordingly, there remain a number of non-trivial challenges with respect to forming large arrays of semiconductor devices.

BRIEF DESCRIPTION OF THE DRAWINGS

FIGS. 5A' and 5B' are cross-sectional and plan views, respectively, that illustrate an alternative stage in the example process for forming an integrated circuit configured with semiconductor devices having different pitches, in accordance with an embodiment of the present disclosure.

FIGS. 6A' and 6B' are cross-sectional and plan views, respectively, that illustrate an alternative stage in the example process for forming an integrated circuit configured with semiconductor devices having different pitches, in accordance with an embodiment of the present disclosure.

Figure 1A:
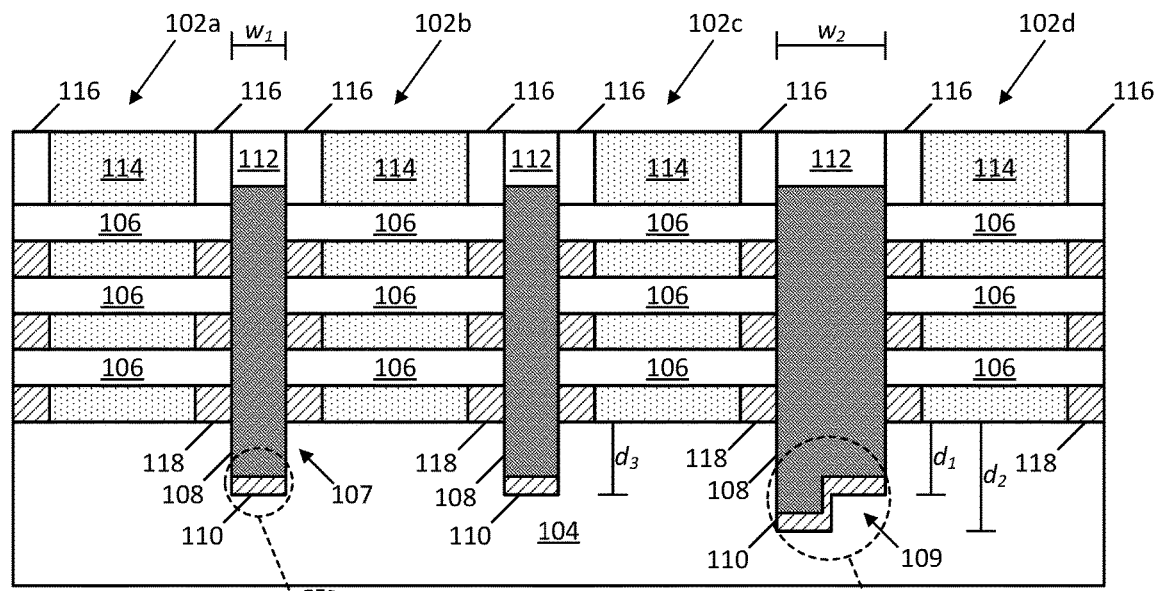
FIG. 1A is a cross-sectional view and FIG. 1B is a plan view of an integrated circuit including semiconductor devices with different pitches, in accordance with some embodiments of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form semiconductor devices having different pitches, yet maintaining a substantially similar depth to the epitaxial trenches between the semiconductor regions. The techniques can be used in any number of integrated circuit applications and are particularly useful with respect to logic and memory cells, such as those cells that use finFETs or gate-all-around transistors. In an example, a row of semiconductor devices having semiconductor regions extending in a first direction can include some devices having a diffusion region (which includes a source or drain region) with a first width in the first direction and some devices having a diffusion region with a second width in the first direction, where the second width is different from the first width (e.g., by 2 nm or more). The difference in the widths of the diffusion regions yields a different pitch between the semiconductor devices along the first direction. The depths of the diffusion regions having both the first and second widths may be substantially similar (e.g., within 2 nm). In some examples, the bottom surface of at least one of the wider diffusion regions has a step profile, with an upper portion of that step profile having a depth similar to the narrower diffusion regions, and a lower portion of that step profile extending deeper than the upper portion of that step profile. As used herein, the term diffusion region refers to the entire region between the semiconductor regions of adjacent devices and can include a source or drain region along with other dielectric materials. Numerous variations and embodiments will be apparent in light of this disclosure.

General Overview

As previously noted above, there remain a number of non-trivial challenges with respect to forming a large array of semiconductor devices. Specifically, devices may have different pitches such that the diffusion regions between adjacent devices do not all have a consistent width. When performing the etch process to form the diffusion regions, any diffusion regions that are wider may etch faster compared to narrower diffusion regions which yields inconsistent etch depth across the integrated circuit. Etching the diffusion regions too deep can cause problems by exposing a large portion of the subfin and potentially growing some of the source or drain region on the subfin, which may cause unintended performance issues. However, etching the diffusion regions too shallow can make back-end-of-the-line (BEOL) processing more difficult by complicating the connection of backside structures to the source or drain regions.

Thus, and in accordance with an embodiment of the present disclosure, techniques are provided herein to form semiconductor devices having substantially similar diffusion region depths, even when having different pitches. The pitch may be determined relative to a first direction along the length of the semiconductor regions (e.g., nanoribbons or fins) of the semiconductor devices. Gate structures extend over the semiconductor regions of one or more semiconductor devices in a second direction different from the first direction (e.g., orthogonal to the first direction). In some embodiments, at least one of the diffusion regions having a larger width (e.g., larger pitch) along the first direction exhibits a step profile to its depth due to a masking procedure used to bring the depths of each of the diffusion regions closer to one another, as will be explained in turn. Regardless of the diffusion profile, the depths of the various diffusion regions are consistent across those having the same width, according to some embodiments. For example, a first set of diffusion regions having a first width may each have a first depth while a second set of diffusion regions having a different second width may each have a second depth that is close to the first depth, but need not be identical (e.g., within 2 nm, 1 nm, or 5 angstroms of the first depth). Each of the diffusion regions may include one or more dielectric materials at the bottom of the region beneath a source or drain region, such as inner spacer dielectric material and/or flowable fill dielectric material provisioned during source drain processing. In some examples where wider diffusion regions have a step profile, an upper portion of that step profile may have a depth similar to the narrower diffusion regions (e.g., within 2 nm, 1 nm, or 5 angstroms of the narrower diffusion regions), and a lower portion of that step profile may have a depth deeper than the narrower diffusion regions (e.g., 3 nm to 5 nm deeper).

According to an embodiment, an integrated circuit includes a semiconductor device having one or more semiconductor regions extending in a first direction between a first source or drain region and a second source or drain region, and a gate layer comprising a conductive material, the gate layer extending over the one or more semiconductor regions. The first source or drain region is part of a first diffusion region having a first width in the first direction and the second source or drain region is part of a second diffusion region having a second width in the first direction that is greater than the first width. In some such cases, the second diffusion region has a bottom surface with a step profile beneath the second source or drain region. The one or more semiconductor regions may include any number of nanoribbons, nanowires, or nanosheets.

According to another embodiment, an integrated circuit includes one or more first semiconductor devices having one or more first semiconductor regions extending in a first direction between first source or drain regions, and one or more second semiconductor devices having one or more second semiconductor regions extending in the first direction between second source or drain regions. The first source or drain regions are part of first diffusion regions that have a first width in the first direction and a first depth extending beneath the first source or drain regions. The second source or drain regions are part of second diffusion regions that have a second width in the first direction that is greater than the first width and a second depth extending beneath the second source or drain regions, the second depth being within 2 nm of the first depth.

According to another embodiment, a method of forming an integrated circuit includes forming a plurality of fins comprising semiconductor material, wherein the plurality of fins extend parallel to one another in a first direction; forming a first plurality of sacrificial gate layers and a second plurality of sacrificial gate layers extending over the plurality of fins in a second direction different from the first direction, the first plurality of sacrificial gate layers having a first pitch between adjacent sacrificial gate layers and the second plurality of sacrificial gate layers having a second pitch between adjacent sacrificial gate layers, the first pitch being greater than the second pitch; performing a first etching process through a portion of the plurality of fins to form first source or drain trenches between the first plurality of sacrificial gate layers and to form second source or drain trenches between the second plurality of sacrificial gate layers; masking the first source or drain trenches; and performing a second etching process to increase a depth of the second source or drain trenches between the second plurality of sacrificial gate layers.

The techniques can be used with any type of non-planar transistors, including finFETs (sometimes called double-gate transistors, or tri-gate transistors), or nanowire, nanosheet, and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The source and drain regions may be any epitaxial diffusion region. The gate structure can be implemented with a gate-first process or a gate-last process (sometimes called a remove metal gate, or RMG, process). Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD);

energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of a step discontinuity in the depth of one or more diffusion regions. The step-like depth profile may be observed in a diffusion region that is wider than other diffusion regions. In some embodiments, such tools may indicate a first set of semiconductor devices having diffusion regions of a first width and a first depth and a second set of semiconductor devices having diffusion regions of a second width and a second depth that is very close to the first depth (e.g., within 1 nm, 2 nm, or 5 nm of the first depth). The narrower diffusion regions may also exhibit more sidewall damage compared to the wider diffusion regions. Numerous configurations and variations will be apparent in light of this disclosure.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Architecture

FIG. 1A is a cross sectional view taken across a plurality of semiconductor devices 102a-102d, according to an embodiment of the present disclosure. Each of semiconductor devices 102a-102d may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons, nanowires, or nanosheets that extend between source and drain regions).

As can be seen, semiconductor devices 102a-102d are formed over a substrate 104. Any number of semiconductor devices can be formed on or over substrate 104, but four are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, substrate 104 can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrate configurations can be used. In some embodiments, substrate 104 is removed from the backside and replaced with one or more backside interconnect layers to provide backside power and/or signal routing.

Each of semiconductor devices 102a-102d includes one or more nanoribbons 106 that extend parallel to one another along a first direction between corresponding source or drain regions 108. Nanoribbons 106 are one example of semiconductor regions that extend between source or drain regions 108. The term nanoribbon may also encompass other similar shapes such as nanowires or nanosheets. The semiconductor material of nanoribbons 106 may be formed from substrate 104. In some other embodiments, semiconductor devices 102a-102d may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

According to some embodiments, some of the semiconductor devices are separated by a first pitch along the first direction while others are separated by a second pitch along the first direction. In the illustrated example, the semiconductor regions of semiconductor devices 102a-102c are separated from each other by diffusion regions 107 having a first width (i.e., first pitch) $w_1$, and the semiconductor regions of semiconductor devices 102c and 102d are separated from each other by a wider diffusion region 109 having a second width (i.e., second pitch) $w_2$. The difference between first width $w_1$ and second width $w_2$ can vary, but in some example embodiments may be between about 3 nm and 20 nm (e.g., between about 3 nm and about 5 nm, between about 5 nm and about 10 nm, or between about 10 nm and about 15 nm). In some examples, width $w_1$ is between about 40 nm and about 50 nm and width $w_2$ is between about 45 nm and about 55 nm. In some other examples, width $w_1$ is between about 20 nm and about 30 nm and width $w_2$ is between about 40 nm and about 50 nm. In still other examples, width $w_1$ is between about 25 nm and about 35 nm and width $w_2$ is between about 45 nm and about 70 nm. In one specific example, width $w_1$ is around 45 nm and width $w_2$ is around 50 nm.

As noted above, each of first diffusion region 107 and second diffusion region 109 includes a source or drain region 108 between nanoribbons 106 and may also include one or more bottom dielectric layers 110 beneath the source or drain regions 108. Any of source or drain regions 108 may act as either a source region or a drain region, depending on the application and dopant profile. Any semiconductor materials suitable for source and drain regions can be used (e.g., group IV and group III-V semiconductor materials) for any of the illustrated source or drains region 108. In any such cases, the composition and doping of source or drain regions 108 may be the same or different, depending on the polarity of the transistors. In an example, semiconductor devices 102a-102d are p-type MOS (PMOS) transistors having a high concentration of p-type dopants in the associated source or drain regions 108, or semiconductor devices 102a-102d are n-type MOS (NMOS) transistors having a high concentration of n-type dopants in the associated source or drain regions 108. Any number of source and drain configurations and materials can be used. Bottom dielectric layers 110 may be any suitable dielectric material such as silicon oxide, silicon nitride, or silicon oxynitride, to name a few examples.

As can be seen, and according to some embodiments, second diffusion region 109 has a stepped depth profile with a first portion having a first depth $d_1$ and a second portion having a second depth $d_2$ greater than $d_1$. The transition between $d_1$ and $d_2$ may be abrupt (e.g., a 90-degree step) or may be gradual (e.g., occurring over a distance of 1 nm to 3 nm). While dimensions can vary from one example embodiment to the next, in some examples $d_1$ may be between about 5 nm and about 15 nm while $d_2$ may be between about 7 nm and about 25 nm.

As can be further seen in the alternative views in the dashed circles, note that the shape of diffusion regions 107 and 109 (and the corresponding source or drain region 108) can vary, given real world process limitations. In this particular alternative case, a given diffusion region (107 and 109) tapers inward toward the bottom of the diffusion trench, and the step profile of diffusion region 109 has a less abrupt transition from the upper portion ($D_{upper}$) of the step to the lower portion ($D_{lower}$) of the step. As noted above, the difference between depth $d_1$ of the upper portion and depth $d_2$ of the lower portion (designated as $\Delta D$ in the dashed circle on right side of FIG. 1A) can vary, but in some examples is in the range of about 3 nm to 10 nm. In this particular alternative case, source or drain region 108 does not exhibit the same step profile within diffusion region 109. Further note that dielectric layer 110 for diffusion region 109 in this particular example includes two different dielectric materials 110a and 110b. Dielectric material 110a can be, for example, the same as inner spacer 118 material which deposits in the bottom of the diffusion trench during inner spacer 118 formation, according to some such embodiments. Dielectric material 110b can be, for example, dielectric fill material (e.g., flowable silicon oxide) deposited after epitaxial source drain regions are grown, to plug any remaining voids within the diffusion trenches. As can be further seen in this particular example, dielectric layer 110 for diffusion regions 107 only includes dielectric material 110a (e.g., inner spacer 118 material). Further note how, due to the smaller width $w_1$ as well as tapering (narrowing) at the bottom portion of the trench for diffusion regions 107, the dielectric material 110a fills up more of the trench bottom (e.g., due to pinch-off), and source or drain regions 108 grow downward to the upper surface of dielectric material 110a, thus leaving no void or further space in which dielectric material 110b can flow or otherwise deposit. In other examples, such as the example shown in FIG. 1C, diffusion regions 107 may have dielectric material 110b between dielectric material 110a and source or drain regions 108, like diffusion regions 109.

First diffusion region 107 has a depth of $d_3$ which is similar to depth $d_1$ of second diffusion region 109, according to some embodiments. While dimensions can vary from one example embodiment to the next, $d_3$ may be within 2 nm, within 1 nm, or within 5 angstroms of $d_1$. Accordingly, at least to some extent, first diffusion region 107 and second diffusion region 109 have the same or similar depths (e.g., $d_1$ compared to $d_3$) while also having different widths (e.g., $w_1$ compared to $w_2$).

Each of first diffusion region 107 and second diffusion region 109 may include a top dielectric layer 112 that can also fill in regions between adjacent source or drain regions in a second direction orthogonal to the first direction (as seen in the plan view of FIG. 1). Top dielectric layer 112 may be any suitable dielectric material such as silicon oxide, silicon nitride, or silicon oxynitride, to name a few examples. In some embodiments, at least a portion of top dielectric layer 112 is removed to form conductive topside contacts to source or drain regions 108. In some embodiments, top dielectric layer 112 is a flowable dielectric that also fills any voids or space at the bottom of the diffusion trenches (as dielectric material 110b) remaining after formation of source or drain regions 108.

A gate structure 114 extends over each of nanoribbons 106 along the second direction different from the first direction (e.g., orthogonal to the first direction), according to some embodiments. Spacer structures 116 are included on either side of gate structure 114. Spacer structures 116 may include a dielectric material, such as silicon nitride, silicon oxynitride, or silicon oxycarbonitride. Inner spacers 118 may also be provided between nanoribbons 106 to prevent shorting between gate structure 114 and source or drain regions 108. Inner spacers 118 may be the same material as spacer structures 116. In some embodiments, inner spacers 118 and bottom dielectric material 110a include the same material and may be deposited at the same time, as explained above and shown in dashed circles of FIGS. 1A and 1C.

Gate structure 114 includes both a gate dielectric around each of nanoribbons 106 and a gate layer (e.g., gate electrode) over the gate dielectric. The gate dielectric may include a single material layer or multiple material layers. In some embodiments, the gate dielectric includes a first dielectric layer such as an oxide native to nanoribbons 106 (e.g., silicon oxide) and a second dielectric layer on the first dielectric layer and that includes a high-k material (e.g., such as hafnium oxide). The high-k dielectric material may be doped with an element to affect the threshold voltage of the given semiconductor device. In other embodiments, the gate dielectric only includes high-k dielectric material; in still other embodiments, the gate dielectric only includes regular-k dielectric material (e.g., silicon oxide).

According to some embodiments, the conductive gate layer extends over the gate dielectric around nanoribbons 106 and also generally fills the remaining space between the various nanoribbons of any given semiconductor device. The gate layer may include any sufficiently conductive material(s) such as a metal, metal alloy, or doped polysilicon. In some embodiments, the gate layer includes one or more workfunction metals around nanoribbons 106. For instance, in some such embodiments, one or more of semiconductor devices 102a-102d are p-channel devices that include n-type dopants within nanoribbons 106 and includes a workfunction metal having titanium around nanoribbons 106. In some embodiments, one or more of semiconductor devices 102a-102d are n-channel devices that include p-type dopants within nanoribbons 106 and includes a workfunction metal having tungsten around nanoribbons 106. N-type dopants may also be used within the nanoribbons of an n-channel device and p-type dopants may be used within the nanoribbons of a p-channel device in order to tune the transistor's threshold voltage. The gate layer may also include a fill metal or other conductive material around or otherwise on the workfunction metals to fill in the gate electrode structure, should the workfunction metal leave space for same.

Figure 1B:
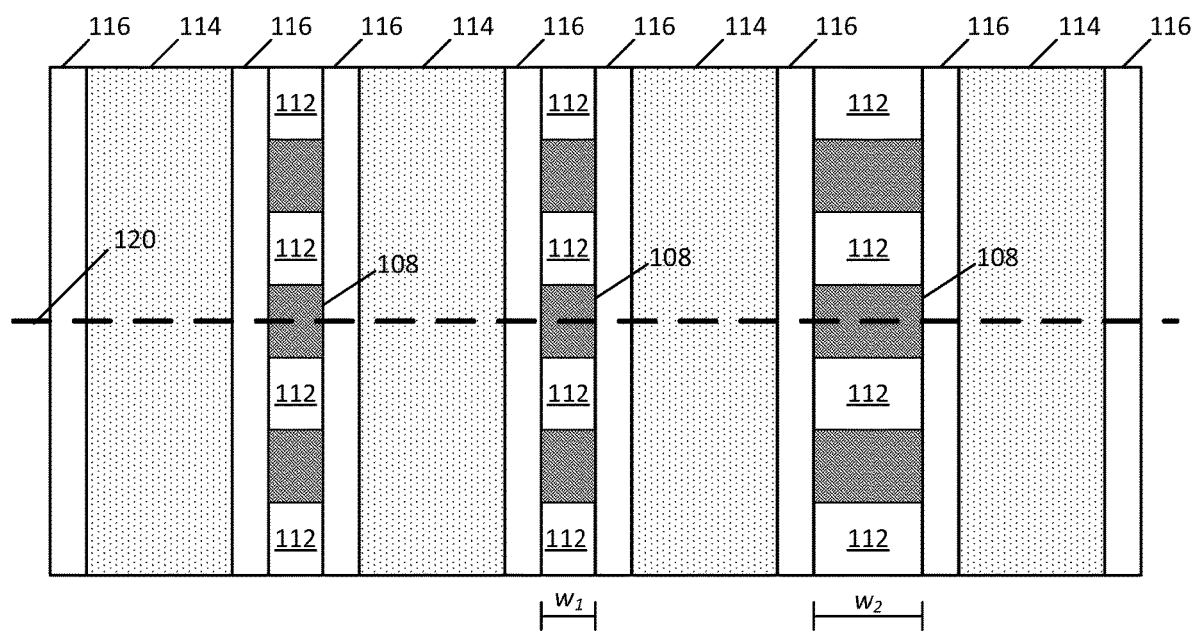

FIG. 1B illustrates a plan view of an integrated circuit that includes each of semiconductor devices 102a-102d along with several other semiconductor devices in a grid-like pattern, according to some embodiments. The dashed line identifies a plane 120 through which the cross-section of FIG. 1A is taken. Spacer structures 116 are provided along sidewalls of the various gate structures, with the diffusion regions present between spacer structures 116. Diffusion regions having different widths ($w_1$ and $w_2$) are observed in the same integrated circuit. Note that top dielectric layer 112 is shown only adjacent to source or drain regions 108 within the various diffusion regions in order to see the source or drain regions 108 in the plan view.

Figure 1C:
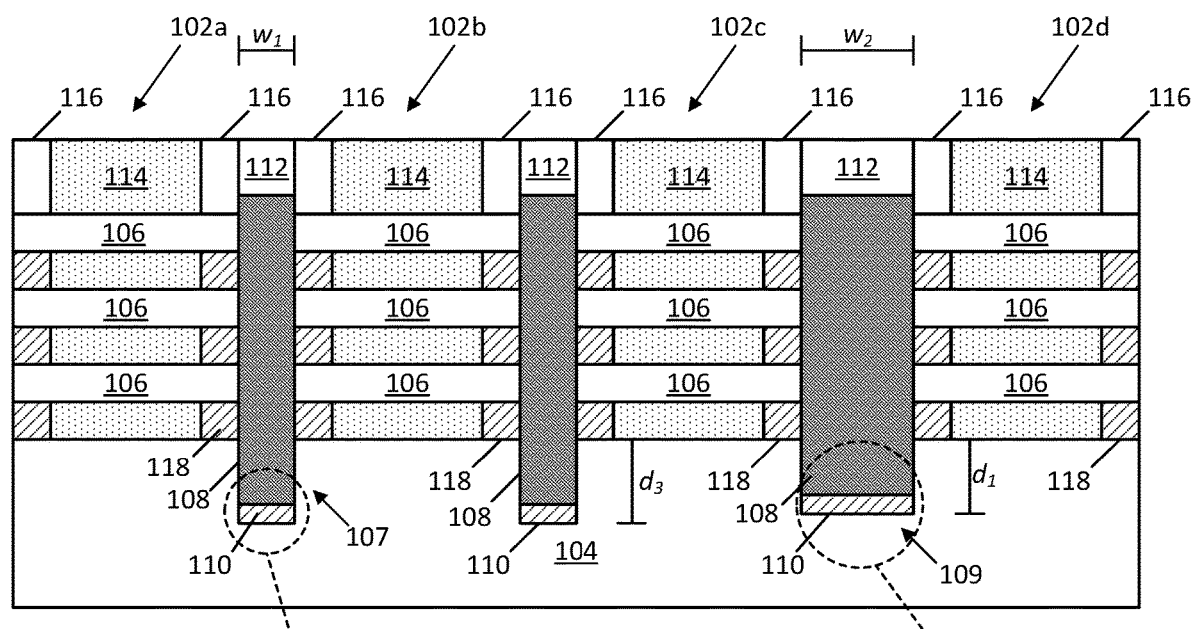
FIG. 1C is a cross-sectional view of an integrated circuit including semiconductor devices with different pitches, in accordance with another embodiment of the present disclosure.
Figure 1C:
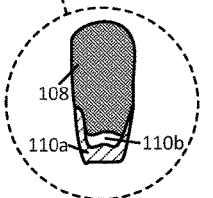
Figure 1C:
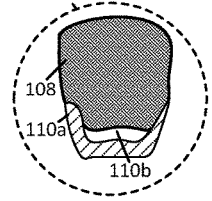

In some embodiments, the diffusion regions having width $w_1$ each have a depth that is different from the depth of each of the diffusion regions having width $w_2$. However, the depths between the diffusion regions are still close to one another (e.g., within 2 nm). FIG. 1C illustrates an example where second diffusion region 109 having width $w_2$ does not have a stepped depth profile but instead has a constant depth of $d_1$, or an otherwise stepless or step-free depth profile, such as a profile that gradually tapers inward with no step or discontinuity in the tapering. Since the depth $d_3$ of first diffusion region 107 is set using two separate etches (as opposed to a single etch process used to set the depth $d_1$ of second diffusion region 109) depth $d_3$ is relatively close to $d_1$ but not necessarily exactly the same (e.g., within 1 or 2 nm, such as the example case where depth $d_3$ is within 5 angstroms of depth $d_1$). Without the benefit of the techniques provided herein, the difference between depth $d_1$ and depth $d_3$ would be relatively much larger (e.g., greater than 5 nm or 10 nm, or more, depending on width of trenches). Since first diffusion regions 107 are subjected to more etching processes compared to second diffusion region 109, the lower sidewalls of first diffusion regions 107 (e.g., beneath gate structures 114) may exhibit higher etch damage (e.g., higher roughness) compared to the lower sidewalls of first diffusion region 107. As previously explained, note that diffusion regions 107 and/or 109 may have dielectric material 110b between dielectric material 110a and source or drain regions 108, as shown in the alternative embodiments within the dashed circles. The previous discussion with respect to tapering (narrowing) and filling of bottom of trench is equally applicable here, so other examples may not include dielectric material 110b between dielectric material 110a and source or drain regions 108.

Fabrication Methodology

FIGS. 2A-9A and 2B-9B are cross-sectional and plan views, respectively, that collectively illustrate an example process for forming an integrated circuit configured with semiconductor devices having different pitches, in accordance with an embodiment of the present disclosure. FIGS. 2A-9A represent a cross-sectional view taken across plane 120 as seen in FIG. 1B, while FIGS. 2B-9B represent plan views of the structure at the corresponding point in the process. Each figure shows an example structure that results from the process flow up to that point in time, so the depicted structure evolves as the process flow continues, culminating in the structure shown in FIGS. 9A and 9B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
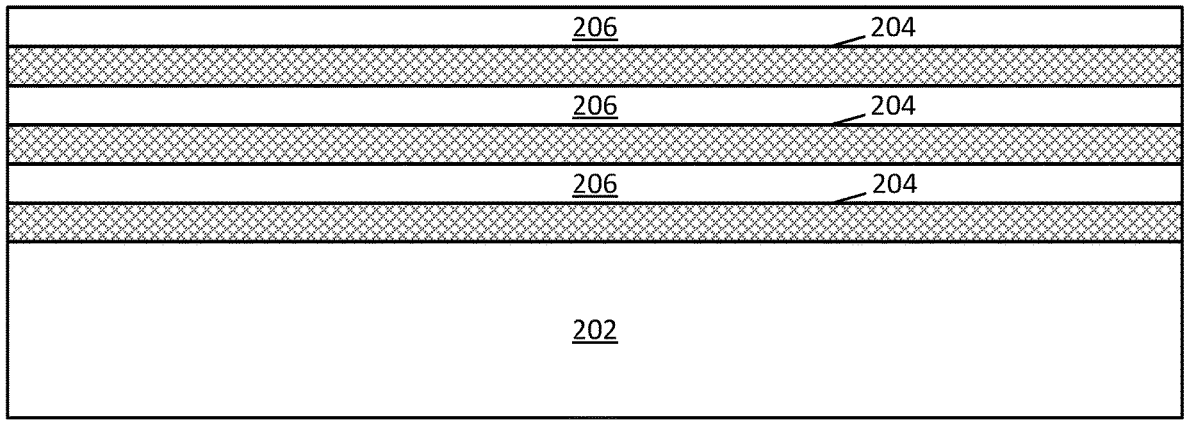
FIGS. 2A and 2B are cross-sectional and plan views, respectively, that illustrate one stage in an example process for forming an integrated circuit configured with semiconductor devices having different pitches, in accordance with an embodiment of the present disclosure.

FIG. 2A illustrates a cross-section view taken through and parallel to a fin of one of the semiconductor devices, according to an embodiment of the present disclosure. Alternating material layers may be deposited over a substrate 202 including sacrificial layers 204 alternating with semiconductor layers 206. The alternating layers are used to form GAA transistor structures. Any number of alternating semiconductor layers 206 and sacrificial layers 204 may be deposited over substrate 202. The description above for substrate 104 applies equally to substrate 202.

According to some embodiments, sacrificial layers 204 have a different material composition than semiconductor layers 206. In some embodiments, sacrificial layers 204 are silicon germanium (SiGe) while semiconductor layers 206 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 204 and in semiconductor layers 206, the germanium concentration is different between sacrificial layers 204 and semiconductor layers 206. For example, sacrificial layers 204 may include a higher germanium content compared to semiconductor layers 206. In some examples, semiconductor layers 206 may be doped with either n-type dopants (to produce a p-channel transistor) or p-type dopants (to produce an n-channel transistor).

While dimensions can vary from one example embodiment to the next, the thickness of each sacrificial layer 204 may be between about 5 nm and about 20 nm. In some embodiments, the thickness of each sacrificial layer 204 is substantially the same (e.g., within 1-2 nm). The thickness of each of semiconductor layers 206 may be about the same as the thickness of each sacrificial layer 204 (e.g., about 5-20 nm). In one example case, the total height of the semiconductor fins (e.g., including the alternating sacrificial layers 204 and semiconductor layers 206) may be between 50 nm and 150 nm, and the width of the fins can be, for example, in the range of 5 to 100 nm. Each of sacrificial layers 204 and semiconductor layers 206 may be deposited using any known material deposition technique, such as chemical vapor deposition (CVD), plasma-enhanced chemical vapor deposition (PECVD), physical vapor deposition (PVD), or atomic layer deposition (ALD).

Figure 2B:
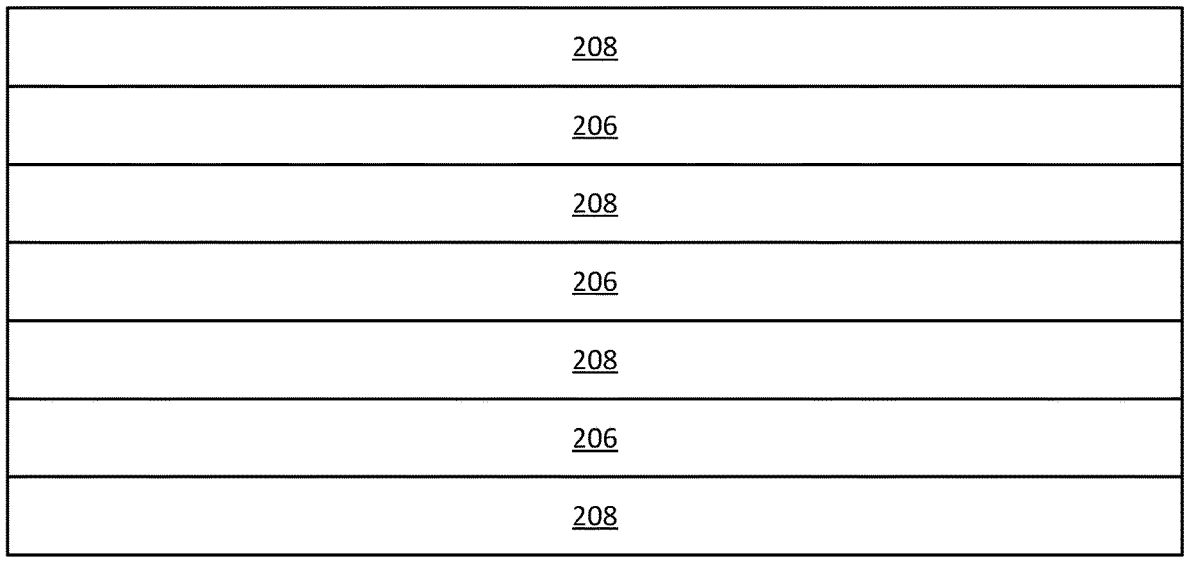

FIG. 2B illustrates a plan view showing parallel fins with only the top-most deposited semiconductor layer 206 shown for each of the fins, according to an embodiment. Depending on the order of the alternating layers, the topmost layer could also be a sacrificial layer 204. A dielectric layer 208 is provided between each adjacent pair of fins, according to some embodiments. Dielectric layer 208 may act as shallow trench isolation (STI) structures between the fins. Dielectric layer 208 may be any suitable dielectric material, such as silicon oxide. The alternating layer stack in each of the fins extends above a top surface of dielectric layer 208, according to some embodiments.

Figure 3A:
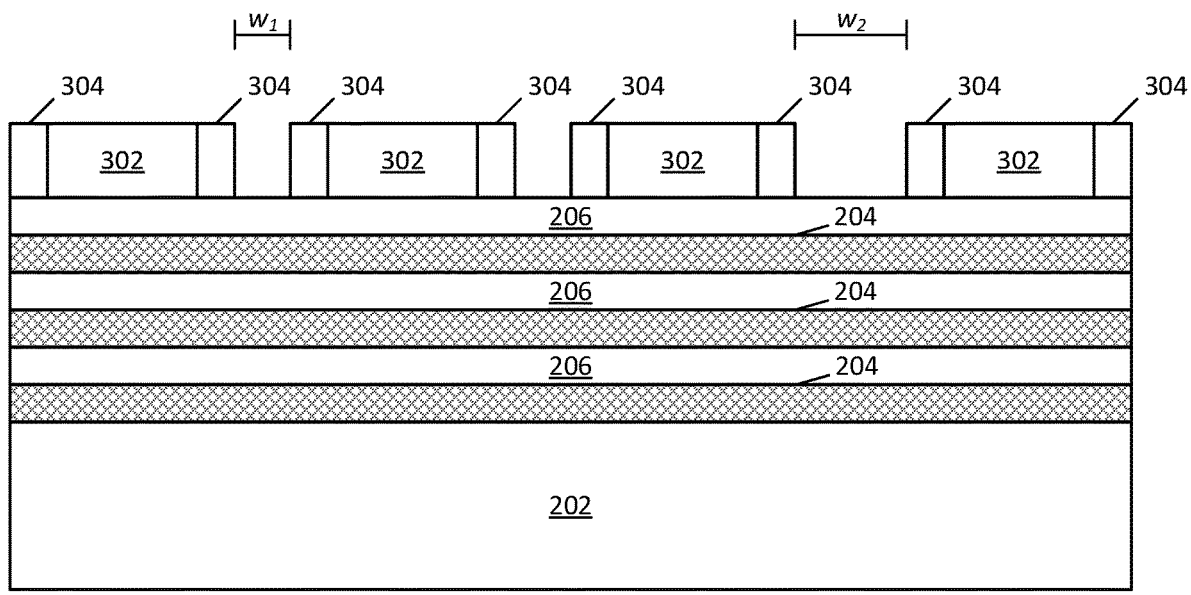
FIGS. 3A and 3B are cross-sectional and plan views, respectively, that illustrate another stage in the example process for forming an integrated circuit configured with semiconductor devices having different pitches, in accordance with an embodiment of the present disclosure.
Figure 3B:
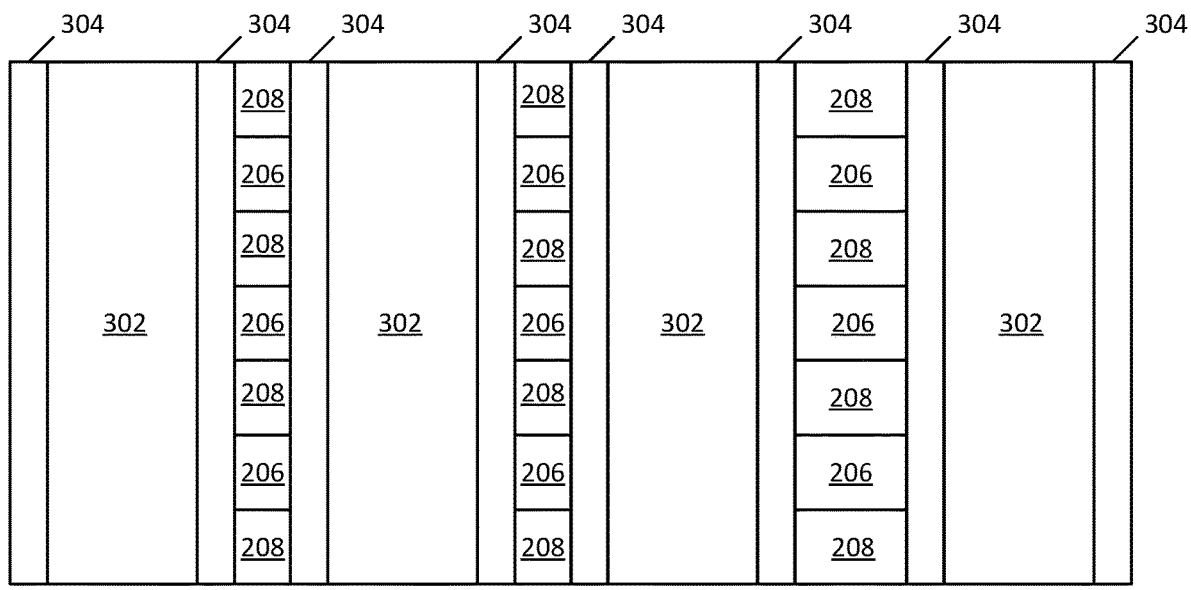

FIGS. 3A and 3B depict the cross-section views of the structure shown in FIGS. 2A and 2B, respectively, following the formation of sacrificial gates 302 and spacer structures 304, according to some embodiments. Sacrificial gates 302 may be patterned in rows over the semiconductor fins and run in an orthogonal direction to a length of the fins as seen in the plan view of FIG. 3B. Sacrificial gates 302 may include any material that can be safely removed later in the process without etching or otherwise damaging the spacer structures 304 and/or the semiconductor material of the fins. Spacer structures 304 may be formed on sidewalls of sacrificial gates 302 and can include any suitable dielectric material, such as silicon nitride. Some portion of spacer structures 304 may also develop on the sidewalls of the fins, according to some embodiments.

According to some embodiments, sacrificial gates 302 may be arranged across the fins at different pitches. In the illustrated example, some sacrificial gates 302 have a smaller pitch between them (identified as width $w_1$) compared to other sacrificial gates 302 with a larger pitch (identified as width $w_2$). In the illustrated example, the widths $w_1$ and $w_2$ identify a distance of the exposed fins between spacer structures 304 on the sidewalls of sacrificial gates 302. These distances correspond to the widths of the diffusion regions that will be formed between the semiconductor regions of the various devices in the proceeding portions of the process.

Figure 4A:
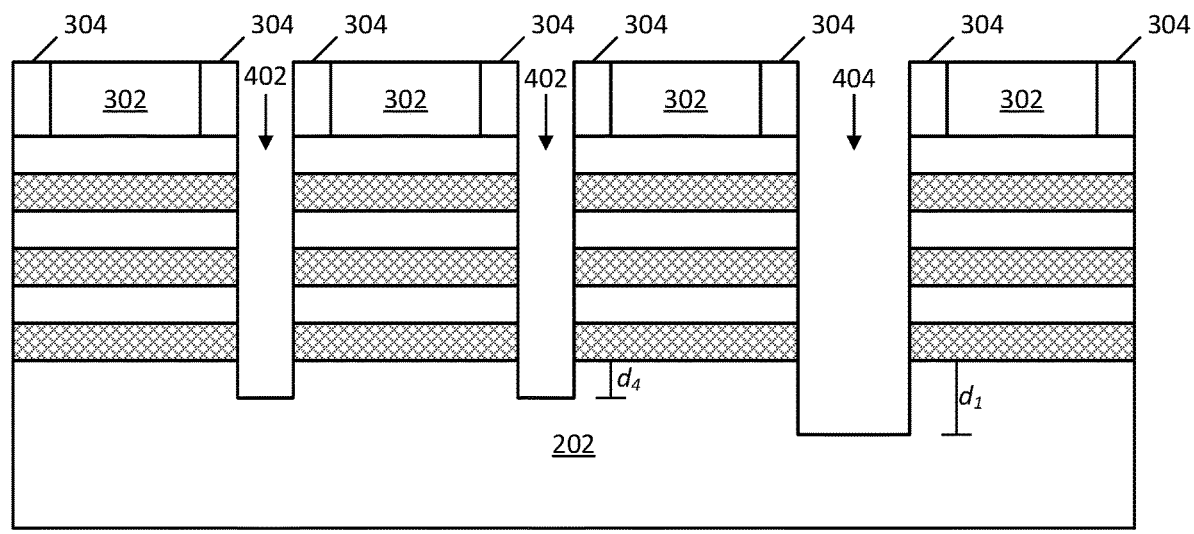
FIGS. 4A and 4B are cross-sectional and plan views, respectively, that illustrate another stage in the example process for forming an integrated circuit configured with semiconductor devices having different pitches, in accordance with an embodiment of the present disclosure.
Figure 4B:
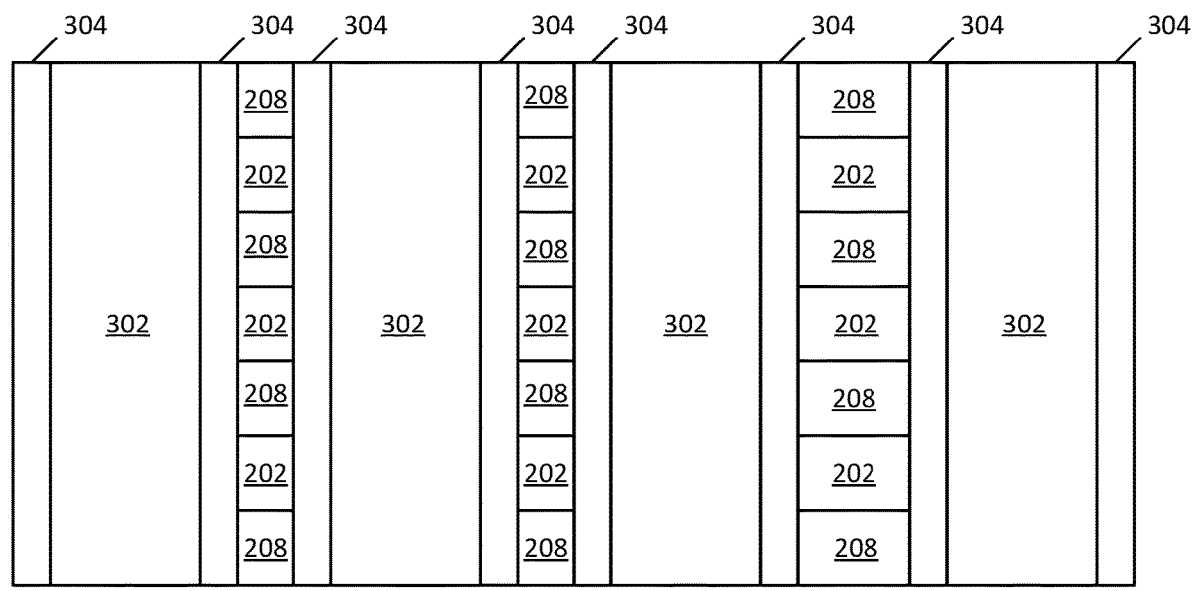

FIGS. 4A and 4B depict the cross-section views of the structure shown in FIGS. 3A and 3B, respectively, following the removal of the exposed fin not under sacrificial gates 302 and spacer structures 304. According to some embodiments, both semiconductor layers 206 and sacrificial layers 204 are etched at substantially the same rate using an anisotropic RIE process. As observed in FIG. 4A, the width of spacer structures 304 works to define the width of each of the diffusion regions etched between adjacent devices. As observed in FIG. 3B, the exposed fin portions are completely removed thus exposing the underlying substrate 202 beneath a top surface of the adjacent dielectric layer 208. The exposed portions of substrate 202 may be subfin regions of the fins adjacent to dielectric layer 208.

According to some embodiments, the etch depth of each of the diffusion regions is not consistent due to the difference in pitch. For example, one or more recesses 402 are created during the RIE process between any devices having a narrower pitch and one or more recesses 404 are created during the same RIE process between any devices having a wider pitch. Due to etch loading effects caused by the difference in pitch, recess 404 has a larger depth $d_1$ compared to a depth $d_4$ of recesses 402. If not corrected, this depth discrepancy can cause problems when forming the source or drain regions and/or when forming backside contacts to the source or drain regions.

Figure 5A:
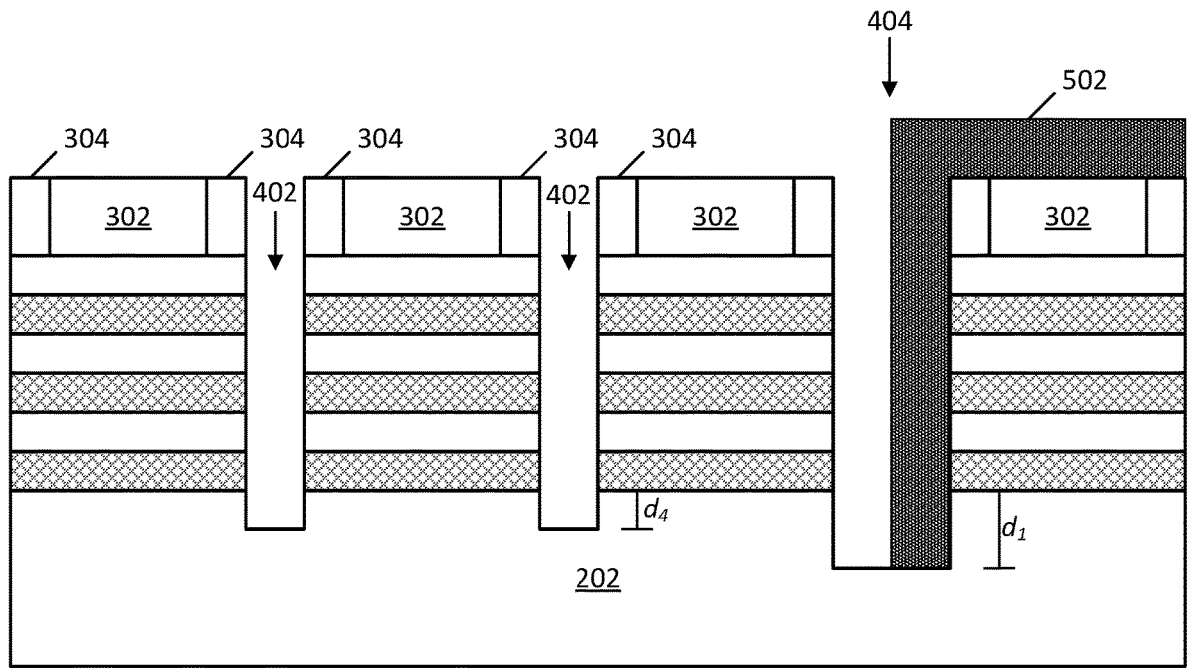
FIGS. 5A and 5B are cross-sectional and plan views, respectively, that illustrate another stage in the example process for forming an integrated circuit configured with semiconductor devices having different pitches, in accordance with an embodiment of the present disclosure.
Figure 5B:
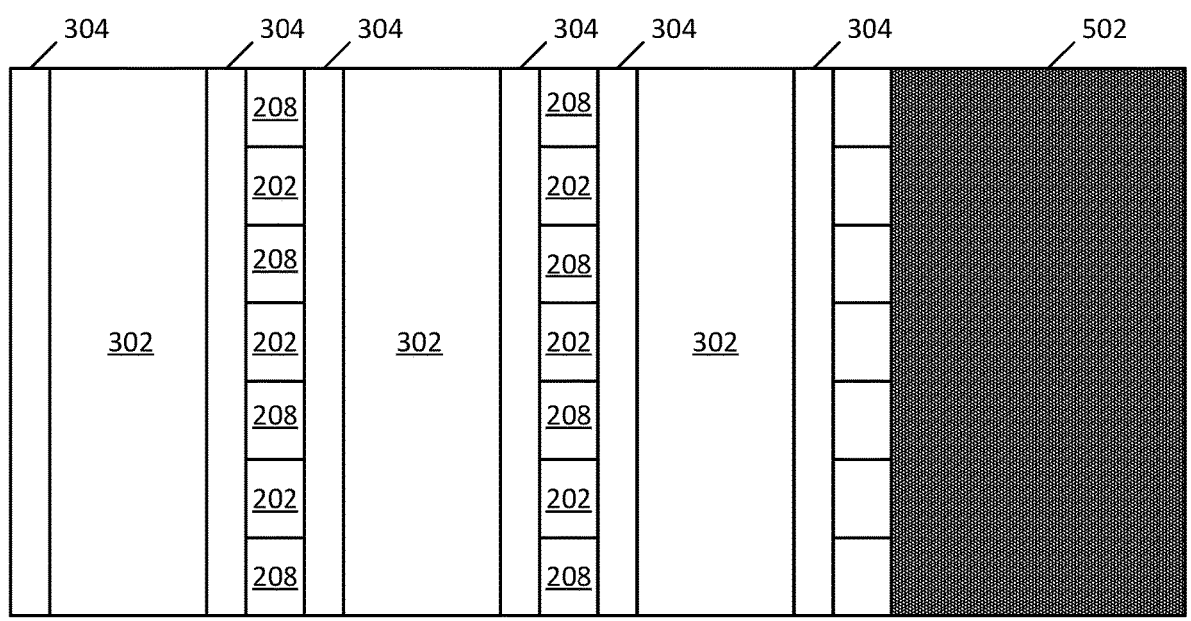
Figure 5A:
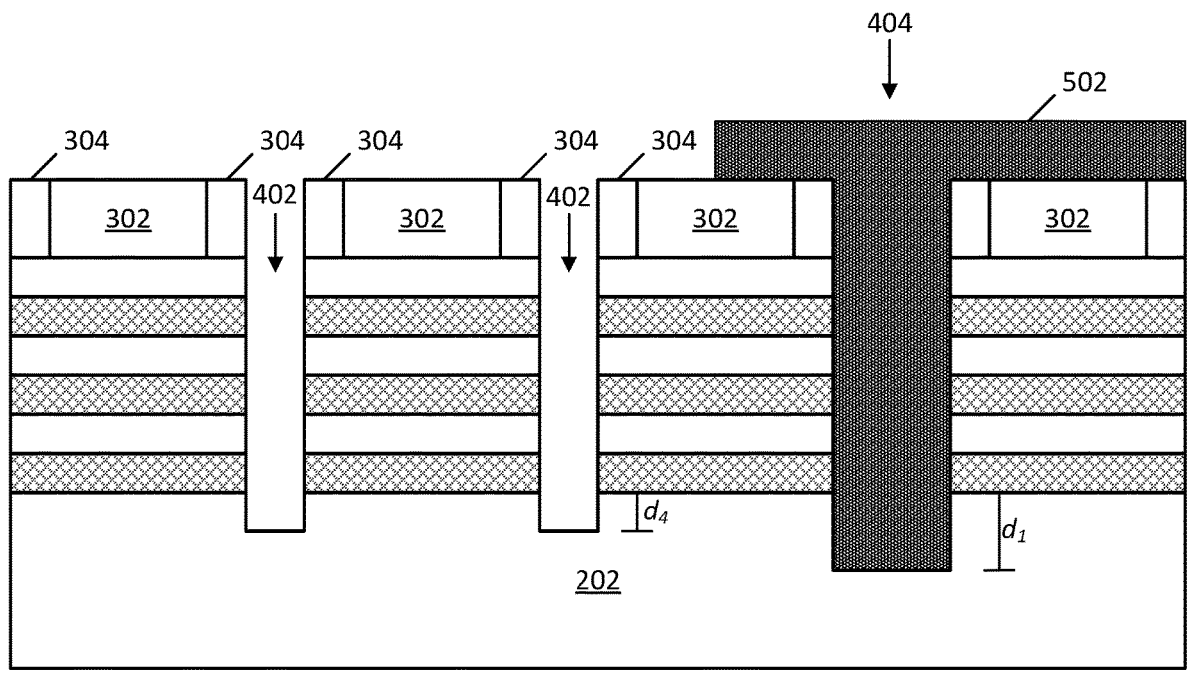
Figure 5B:
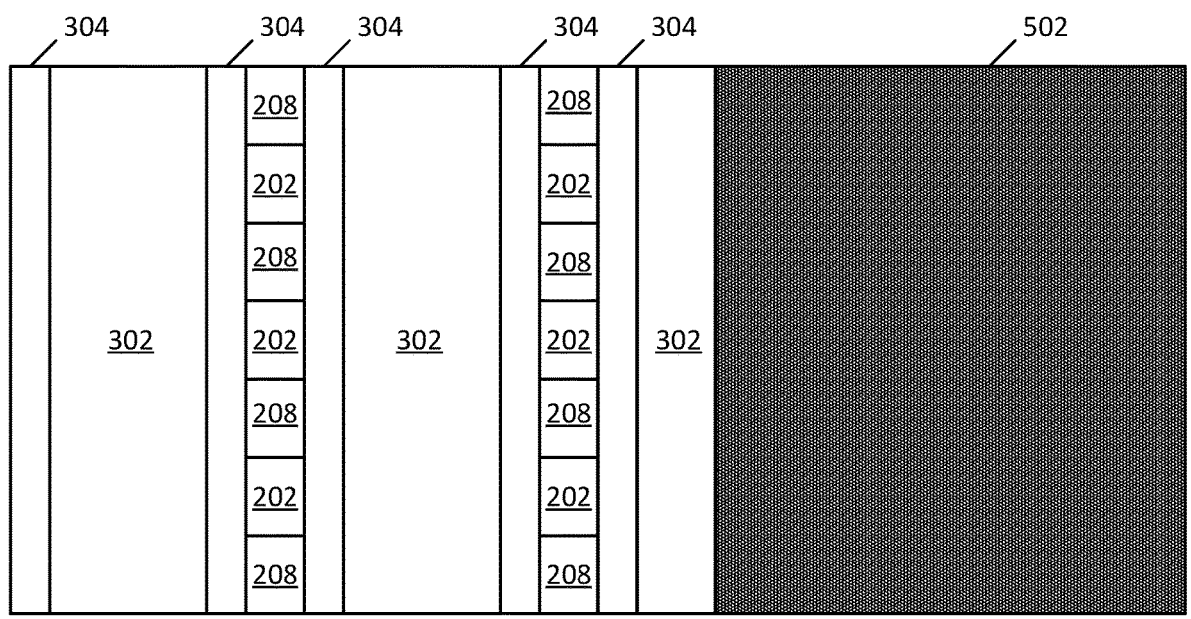

FIGS. 5A and 5B depict the cross-section views of the structure shown in FIGS. 4A and 4B, respectively, following the formation of a mask material 502, according to some embodiments. Mask material 502 may be any suitable hard mask or photoresist material, such as a carbon hard mask (CHM). The purpose of mask material 502 is to protect wider one or more recesses 404 while exposing narrower one or more recesses 402 to a further etching process (shown in the next process) in order to bring its depth $d_4$ closer to the depth $d_1$ of the wider one or more recesses 404. However, alignment of the mask material 502 can be challenging and will likely fall somewhere within wider recess 404, as illustrated. FIGS. 5A' and 5B' illustrate the situation where mask material 502 is aligned such that the edge rests over sacrificial gate 302, according to an embodiment. In this example, mask material 502 covers all of recess 404 while exposing the narrower one or more recesses 402.

Figure 6A:
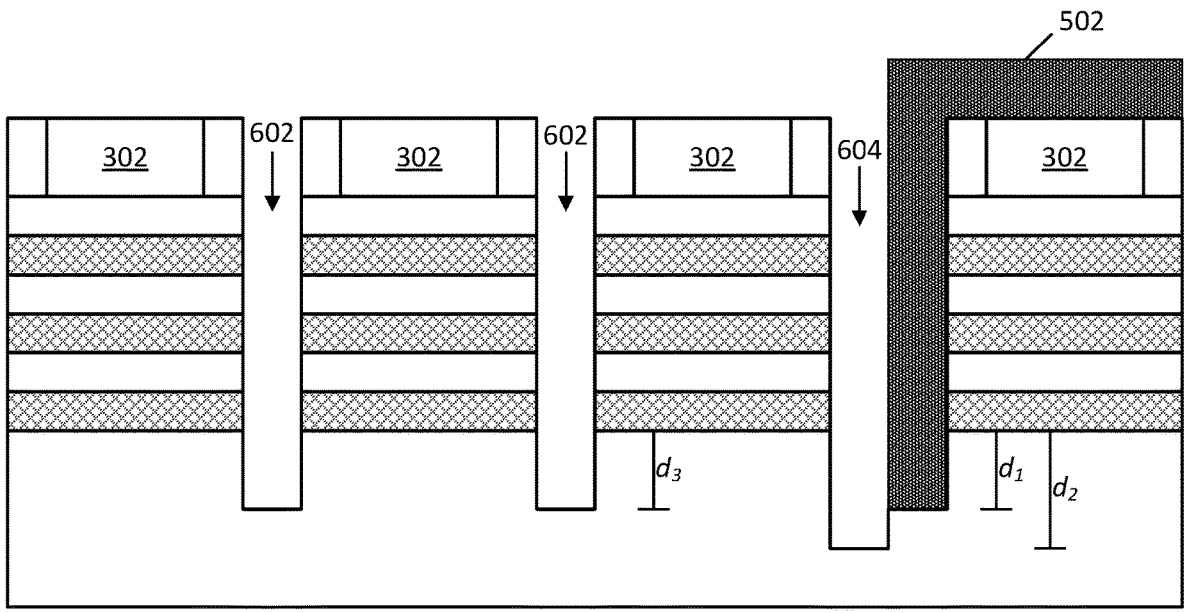
FIGS. 6A and 6B are cross-sectional and plan views, respectively, that illustrate another stage in the example process for forming an integrated circuit configured with semiconductor devices having different pitches, in accordance with an embodiment of the present disclosure.
Figure 6B:
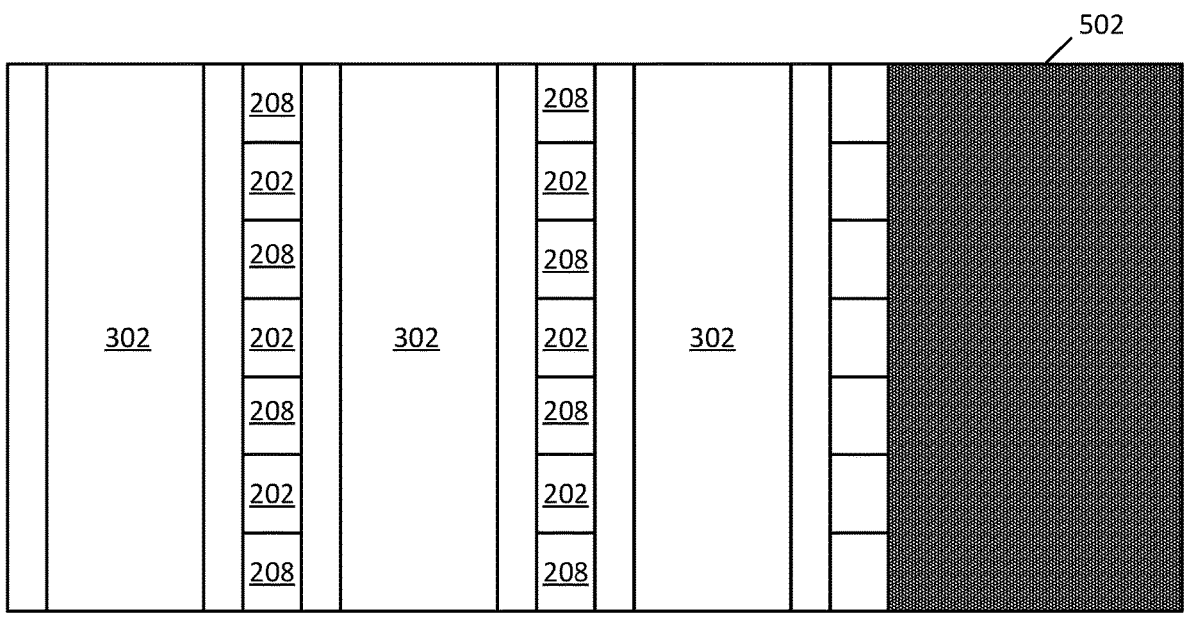
Figure 6A:
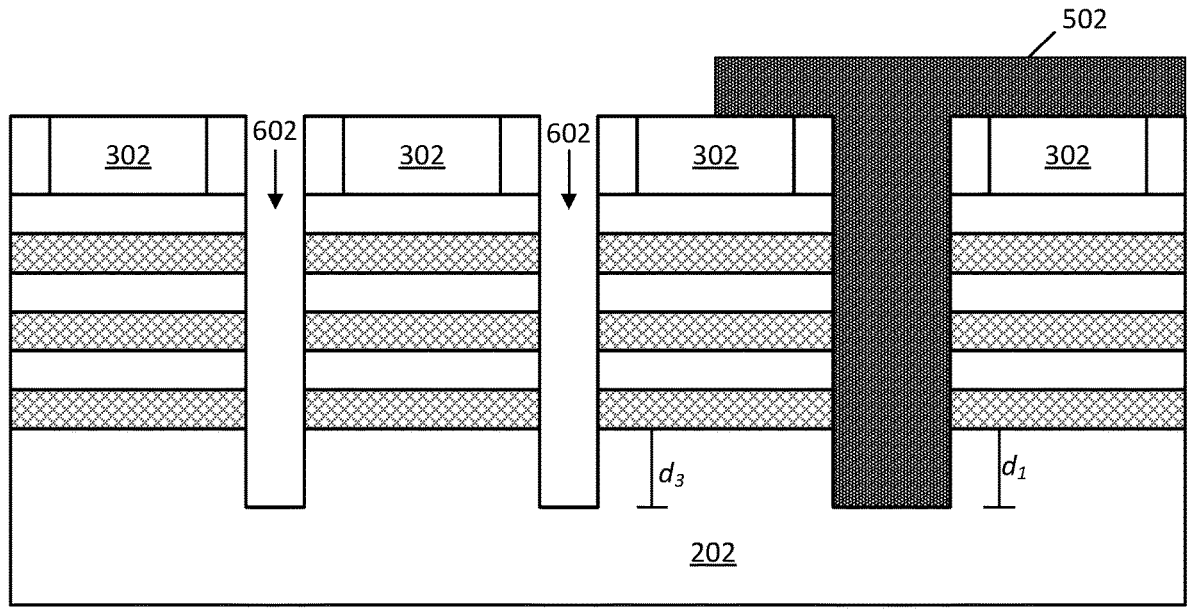
Figure 6B:
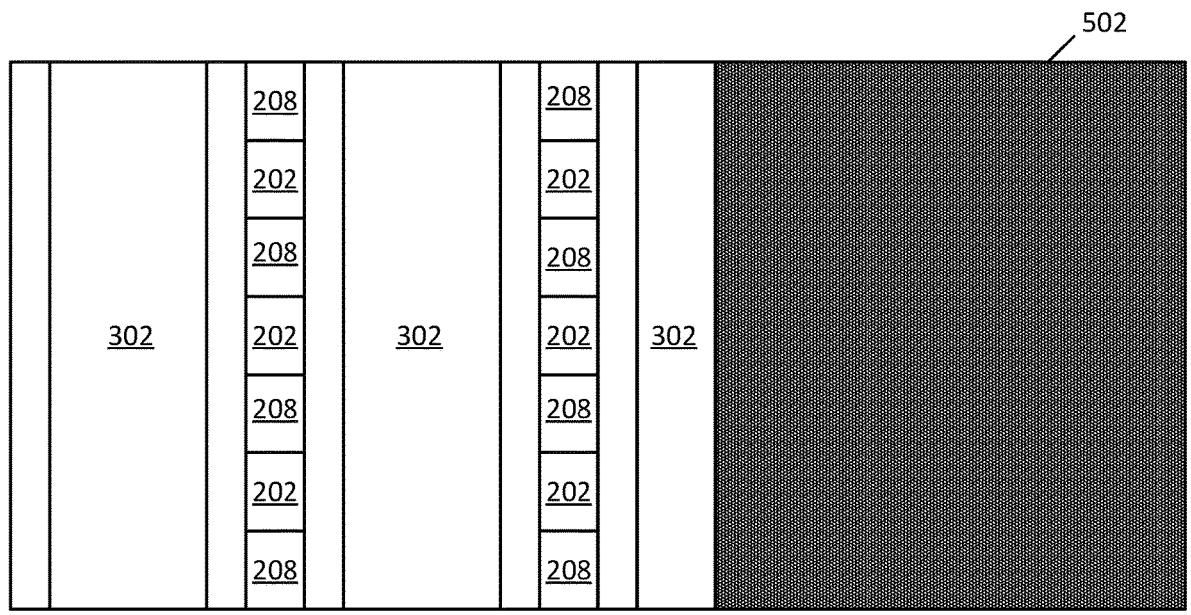

FIGS. 6A and 6B depict the cross-section views of the structure shown in FIGS. 5A and 5B, respectively, following additional etching of the exposed portions of one or more recesses 402 and recess 404, according to some embodiments. One or more recesses 402 are etched using another RIE process to form deeper recesses 602 having a new depth of $d_3$. According to some embodiments, the new depth $d_3$ is substantially similar to the original depth $d_1$ of the wider one or more recesses 404. In some examples, $d_3$ is within 2 nm, within 1 nm, or within 5 angstroms of $d_1$. Each of $d_1$ and $d_3$ may be between about 5 nm and about 15 nm.

Due to the alignment of mask material 502 within the wider recess 404, a portion of recess 404 continues to be etched during the additional RIE process, forming a new recess 604 having a depth $d_2$ that is greater than both $d_1$ and $d_3$. Depending on how much of mask material 502 is present within recess 404, depth $d_2$ may be on the order of a few or more nanometers greater than depth $d_1$ (e.g., depth $d_2$ is 3 nm to 10 nm greater than depth $d_1$). The step profile may be abrupt between $d_1$ and $d_2$ or may be more gradual (e.g., occurring over a distance of about 2 nm to 5 nm).

If mask material 502 is not aligned within wider recess 404, then only one or more recesses 402 are made deeper while wider recess 404 is protected. FIGS. 6A' and 6B' depict the cross-section views of the structure shown in FIGS. 5A' and 5B', respectively, following additional etching of the one or more recesses 402, according to some embodiments. One or more recesses 402 are etched using another RIE process to form deeper recesses 602 having a new depth of $d_3$. According to some embodiments, the new depth $d_3$ is substantially similar to the original depth $d_1$ of the wider one or more recesses 404. In some examples, $d_3$ is within 2 nm, within 1 nm, or within 5 angstroms of $d_1$. Each of $d_1$ and $d_3$ may be between about 5 nm and about 15 nm.

Figure 7A:
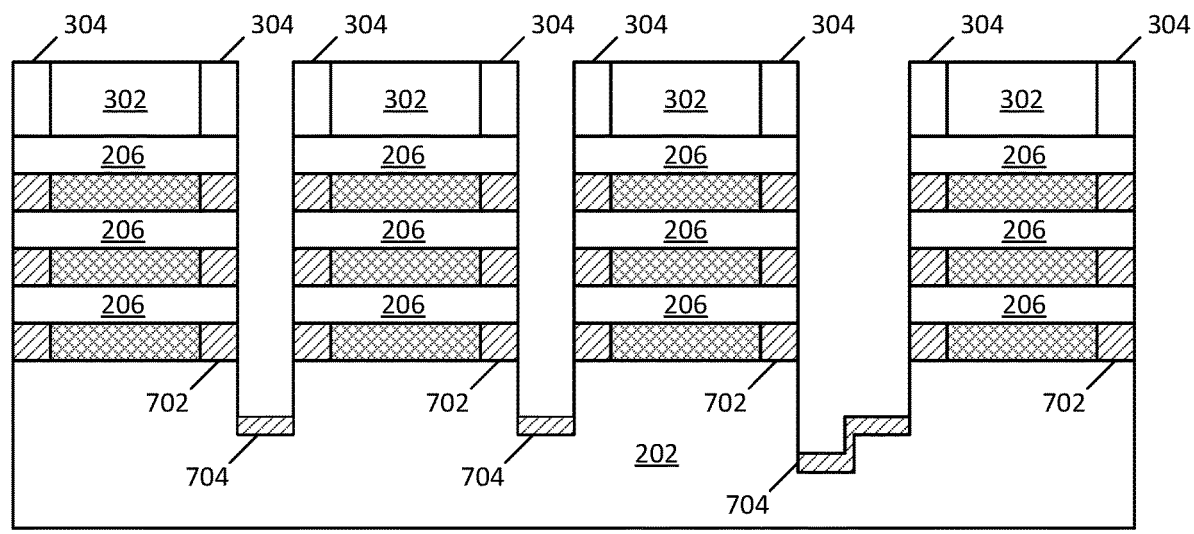
FIGS. 7A and 7B are cross-sectional and plan views, respectively, that illustrate another stage in the example process for forming an integrated circuit configured with semiconductor devices having different pitches, in accordance with an embodiment of the present disclosure.
Figure 7B:
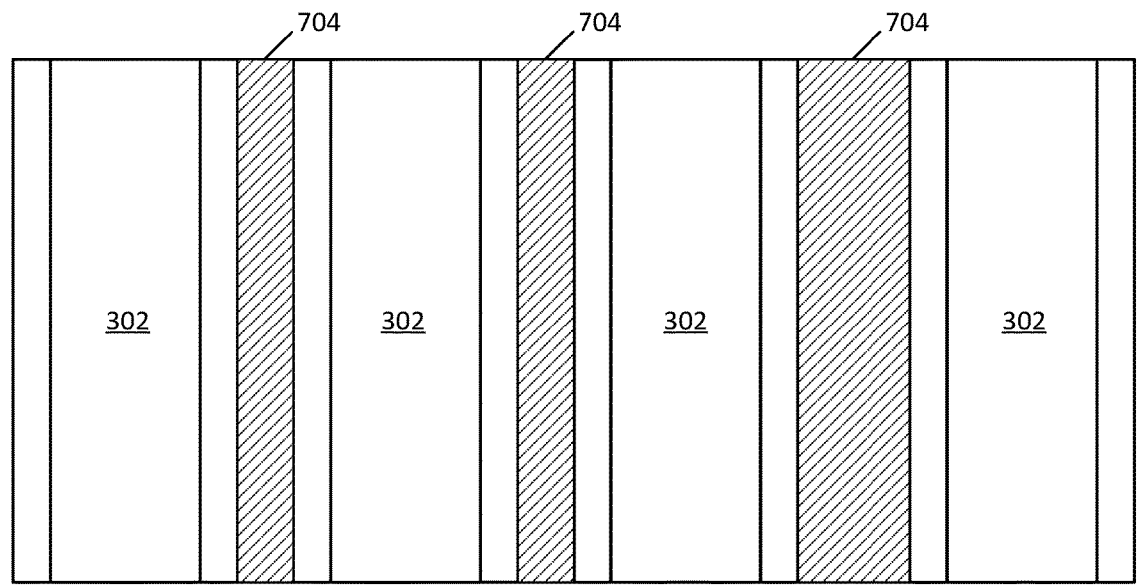

FIGS. 7A and 7B depict the cross-section views of the structure shown in FIGS. 6A and 6B, respectively, following the formation of inner spacers 702. According to some embodiments, the exposed ends of sacrificial layers 204 are laterally recessed using an isotropic etching process that selectively etches sacrificial layers 204 as opposed to semiconductor layers 206. Afterwards, a dielectric material is deposited to effectively fill the dimples between semiconductor layers 206, according to some embodiments. The dielectric material can then be etched back using RIE or a wet isotropic etch at least until the ends of semiconductor layers 206 are exposed, thus forming inner spacers 702 around portions of semiconductor layers 206 near its ends. According to some embodiments, inner spacers 702 have the same material composition as spacer structures 304. Note that inner spacers 702 may only be present when using a gate-all-around (GAA) structure having semiconductor nanoribbons or nanowires. According to some embodiments, a portion of the dielectric material may remain at the bottom of the diffusion region trenches (e.g., the recesses formed between semiconductor layers 206) as bottom dielectric layer 704. According to some embodiments, bottom dielectric layer 704 may also form on portions of the sidewalls at the bottom of the diffusion region trenches, and may fill the deeper portion of any of the wider diffusion region trenches.

Figure 8A:
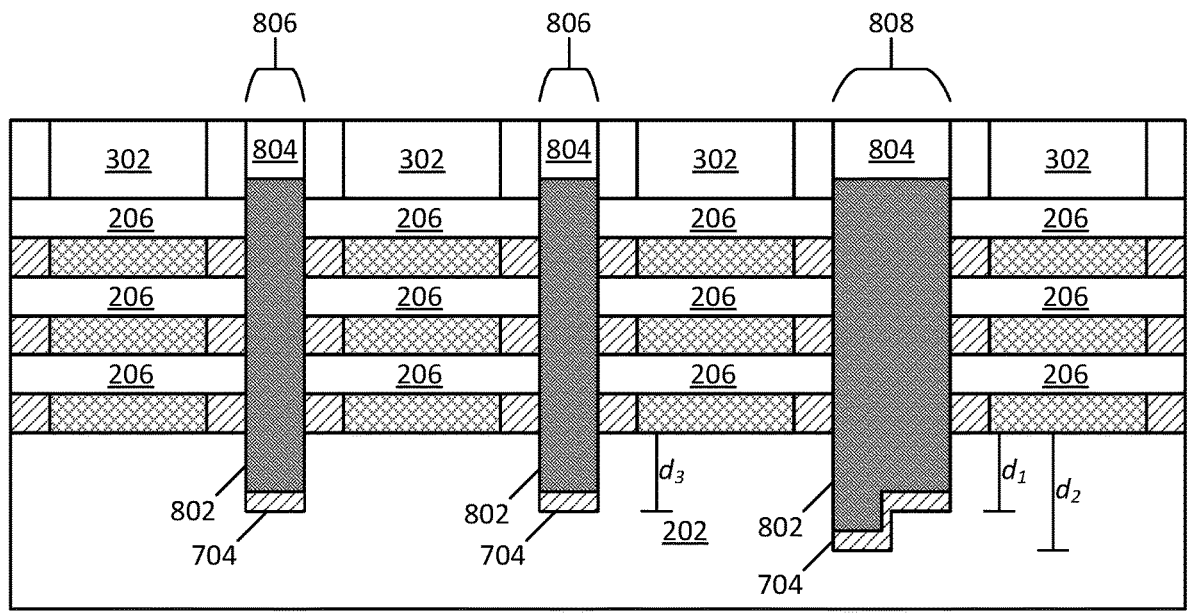
FIGS. 8A and 8B are cross-sectional and plan views, respectively, that illustrate another stage in the example process for forming an integrated circuit configured with semiconductor devices having different pitches, in accordance with an embodiment of the present disclosure.
Figure 8B:
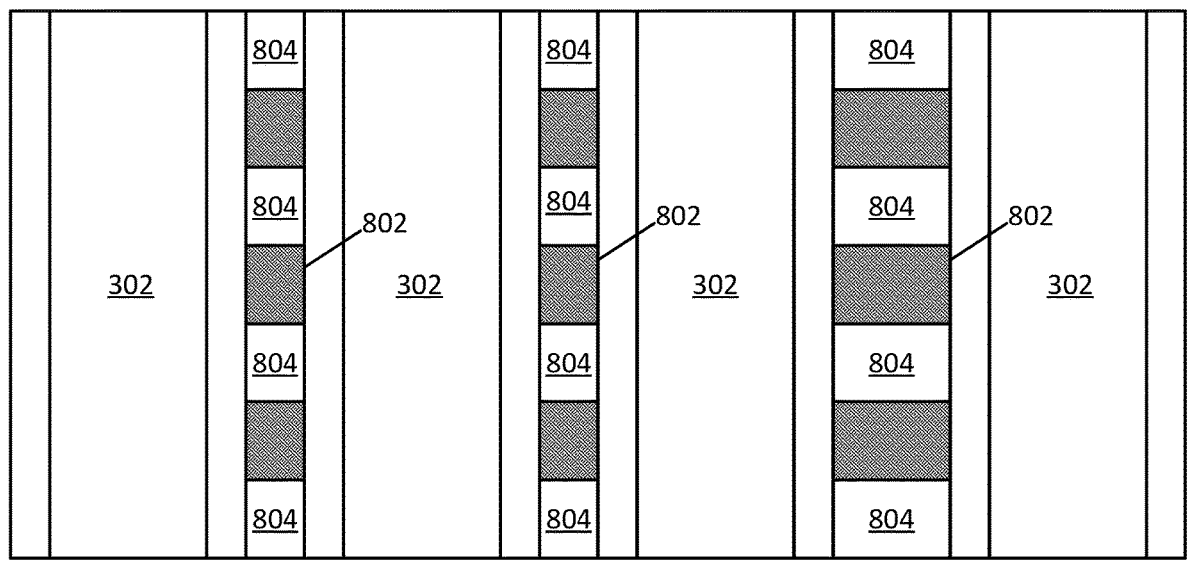

FIGS. 8A and 8B depict the cross-section views of the structure shown in FIGS. 7A and 7B, respectively, following the formation of source or drain regions 802 between the semiconductor layers 206 of each device, according to some embodiments. Source or drain regions 802 may be epitaxially grown from the exposed ends of semiconductor layers 206, such that the material grows together or otherwise merges towards the middle of the trench between the fins, according to some embodiments. In other embodiments, the epitaxial growth may only partially merge, or not merge at all thereby leaving space between the laterally adjacent epi-growths in which contact material can be deposited. The degree of any such merging can vary from one embodiment to the next. In the example of PMOS devices, source or drain regions 802 may be a semiconductor material (e.g., group IV or group III-V semiconductor materials) having a higher dopant concentration of p-type dopants compared to n-type dopants. In the example of NMOS devices, source or drain regions 802 may be a semiconductor material (e.g., group IV or group III-V semiconductor materials) having a higher dopant concentration of n-type dopants compared to p-type dopants.

A top dielectric layer 804 may be formed over source or drain regions 802, as well as adjacent to source or drain regions 802 as seen in FIG. 8B. Accordingly, top dielectric layer 804 may act as dielectric plugs to isolate adjacent source or drain regions in the second direction while also protecting a top surface of source or drain regions 802. Top dielectric layer 804 may be any suitable dielectric material, such as silicon oxide, silicon nitride, or silicon oxynitride. Note that top dielectric layer 804 is not shown over each of source or drain regions 802 in the plan view. Top dielectric layer 804 may be polished using for example, chemical mechanical polishing (CMP) to be planar with a top surface of sacrificial gates 302.

According to some embodiments, each of first diffusion regions 806 and second diffusion regions 808 include trenches filled with bottom dielectric layer 704, source or drain regions 802, and top dielectric layer 804. First diffusion regions 806 have depth $d_3$ into substrate 202 while second diffusion regions 808 exhibit a stepped depth having a first portion at a depth of $d_1$ and a second portion at a depth of $d_2$ into substrate 202. In some embodiments, a flowable dielectric (such as a flowable silicon oxide) may be present between source or drain regions 802 and bottom dielectric layer 704 to plug any voids formed during the growth of source or drain regions 802.

Figure 9A:
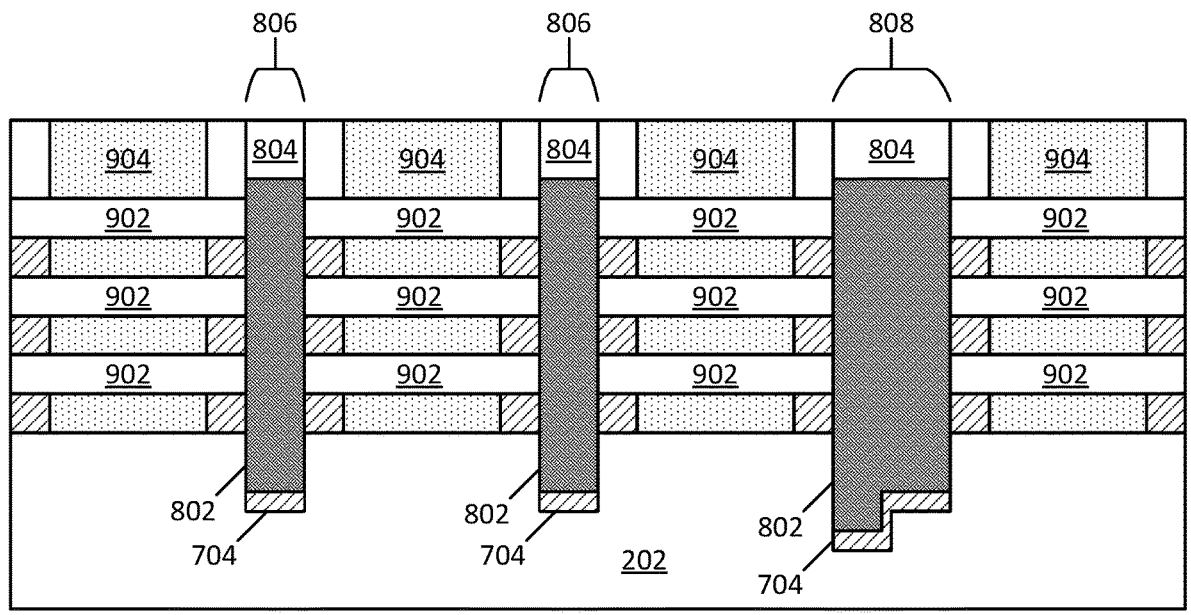
FIGS. 9A and 9B are cross-sectional and plan views, respectively, that illustrate another stage in the example process for forming an integrated circuit configured with semiconductor devices having different pitches, in accordance with an embodiment of the present disclosure.
Figure 9B:
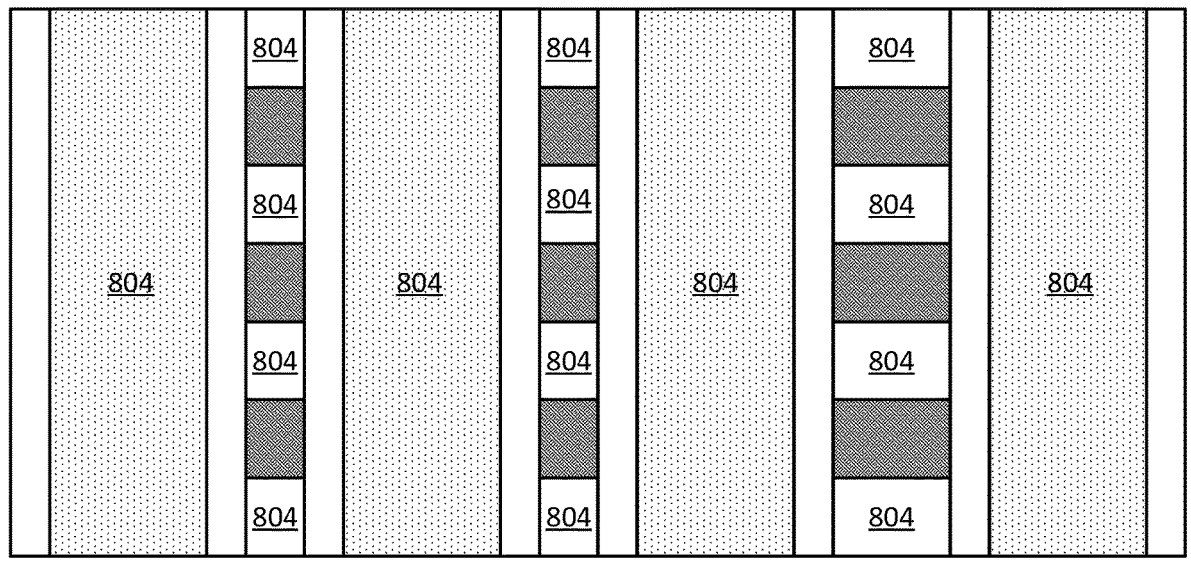

FIGS. 9A and 9B depict the cross-section views of the structure shown in FIGS. 8A and 8B following the removal of sacrificial gates 302 and sacrificial layers 204 and the formation of gate structures 904, according to some embodiments. Sacrificial gates 302 may be removed using any wet or dry isotropic process thus exposing the alternating layer stack of the fins within the trenches left behind after the removal of sacrificial gates 302. Once sacrificial gates 302 are removed, sacrificial layers 204 may also be removed using a selective isotropic etching process that removes the material of sacrificial layers 204 but does not remove (or removes very little of) semiconductor layers 206. At this point, the suspended (sometimes called released) semiconductor layers 206 form nanoribbons (or nanowires or nanosheets) 902 that extend between source or drain regions 802. Each vertical set of nanoribbons 902 represents the semiconductor region of a different semiconductor device. Sacrificial gates 302 and sacrificial layers 204 may be removed using the same isotropic etching process or different isotropic etching processes.

As noted above, gate structures 904 include a gate dielectric and a gate layer. The gate dielectric may be conformally deposited around nanoribbons 902 using any suitable deposition process, such as atomic layer deposition (ALD). The gate dielectric may include any suitable dielectric (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric is hafnium oxide with a thickness between about 1 nm and about 5 nm. In some embodiments, the gate dielectric may include one or more silicates (e.g., titanium silicate, tungsten silicate, niobium silicate, and silicates of other transition metals). The gate dielectric may be a multilayer structure, in some examples. For instance, the gate dielectric may include a first layer on nanoribbons 902, and a second layer on the first layer. The first layer can be, for instance, an oxide of the semiconductor layers (e.g., silicon dioxide) and the second layer can be a high-k dielectric material (e.g., hafnium oxide). In some embodiments, an annealing process may be carried out on the gate dielectric to improve its quality when a high-k dielectric material is used. In some embodiments, the high-k material can be nitridized to improve its aging resistance.

The gate layer may be deposited over the gate dielectric and can be any standard or proprietary gate structure that may include any number of gate cuts. In some embodiments, the gate layer includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate layer may include, for instance, one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

In some embodiments, at least a portion of top dielectric layer 804 may be removed from above source or drain regions 802 to facilitate the formation of topside conductive contacts to source or drain regions 802.

Figure 10:
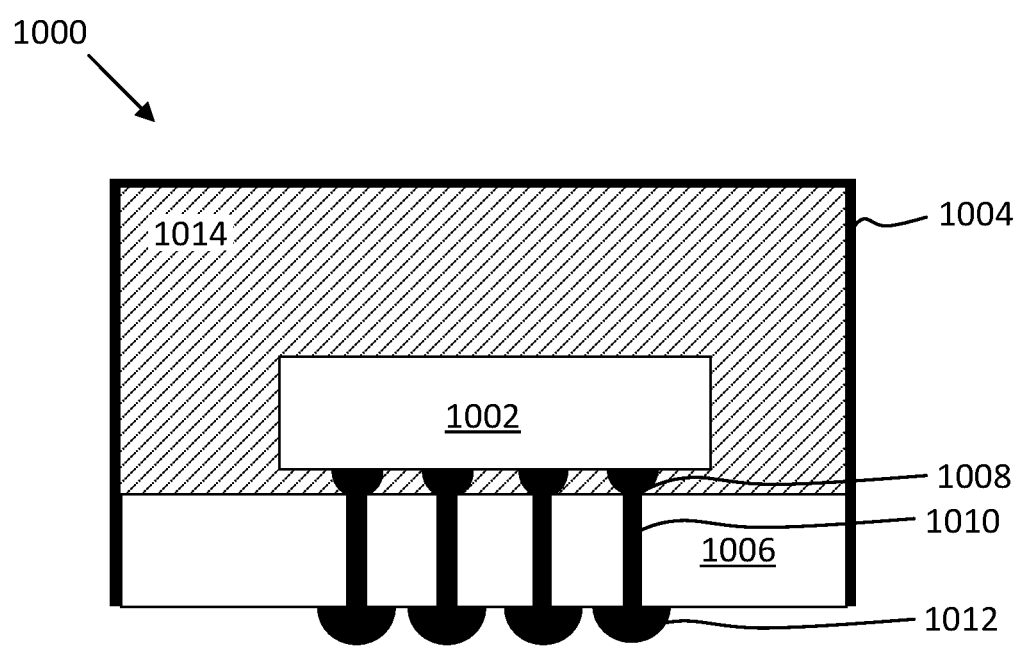
FIG. 10 illustrates a cross-section view of a chip package containing one or more semiconductor dies, in accordance with some embodiments of the present disclosure.

FIG. 10 illustrates an example embodiment of a chip package 1000. As can be seen, chip package 1000 includes one or more dies 1002. One or more dies 1002 may include at least one integrated circuit having semiconductor devices, such as any of the semiconductor devices disclosed herein. One or more dies 1002 may include any other circuitry used to interface with other devices formed on the dies, or other devices connected to chip package 1000, in some example configurations.

As can be further seen, chip package 1000 includes a housing 1004 that is bonded to a package substrate 1006. The housing 1004 may be any standard or proprietary housing, and provides, for example, electromagnetic shielding and environmental protection for the components of chip package 1000. The one or more dies 1002 may be conductively coupled to a package substrate 1006 using connections 1008, which may be implemented with any number of standard or proprietary connection mechanisms, such as solder bumps, ball grid array (BGA), pins, or wire bonds, to name a few examples. Package substrate 1006 may be any standard or proprietary package substrate, but in some cases includes a dielectric material having conductive pathways (e.g., including conductive vias and lines) extending through the dielectric material between the faces of package substrate 1006, or between different locations on each face. In some embodiments, package substrate 1006 may have a thickness less than 1 millimeter (e.g., between 0.1 millimeters and 0.5 millimeters), although any number of package geometries can be used. Additional conductive contacts 1012 may be disposed at an opposite face of package substrate 1006 for conductively contacting, for instance, a printed circuit board (PCB). One or more vias 1010 extend through a thickness of package substrate 1006 to provide conductive pathways between one or more of connections 1008 to one or more of contacts 1012. Vias 1010 are illustrated as single straight columns through package substrate 1006 for ease of illustration, although other configurations can be used (e.g., damascene, dual damascene, through-silicon via). In still other embodiments, vias 1010 are fabricated by multiple smaller stacked vias, or are staggered at different locations across package substrate 1006. In the illustrated embodiment, contacts 1012 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1012, to inhibit shorting.

In some embodiments, a mold material 1014 may be disposed around the one or more dies 1002 included within housing 1004 (e.g., between dies 1002 and package substrate 1006 as an underfill material, as well as between dies 1002 and housing 1004 as an overfill material). Although the dimensions and qualities of the mold material 1014 can vary from one embodiment to the next, in some embodiments, a thickness of mold material 1014 is less than 1 millimeter. Example materials that may be used for mold material 1014 include epoxy mold materials, as suitable. In some cases, the mold material 1014 is thermally conductive, in addition to being electrically insulating.

Methodology

Figure 11:
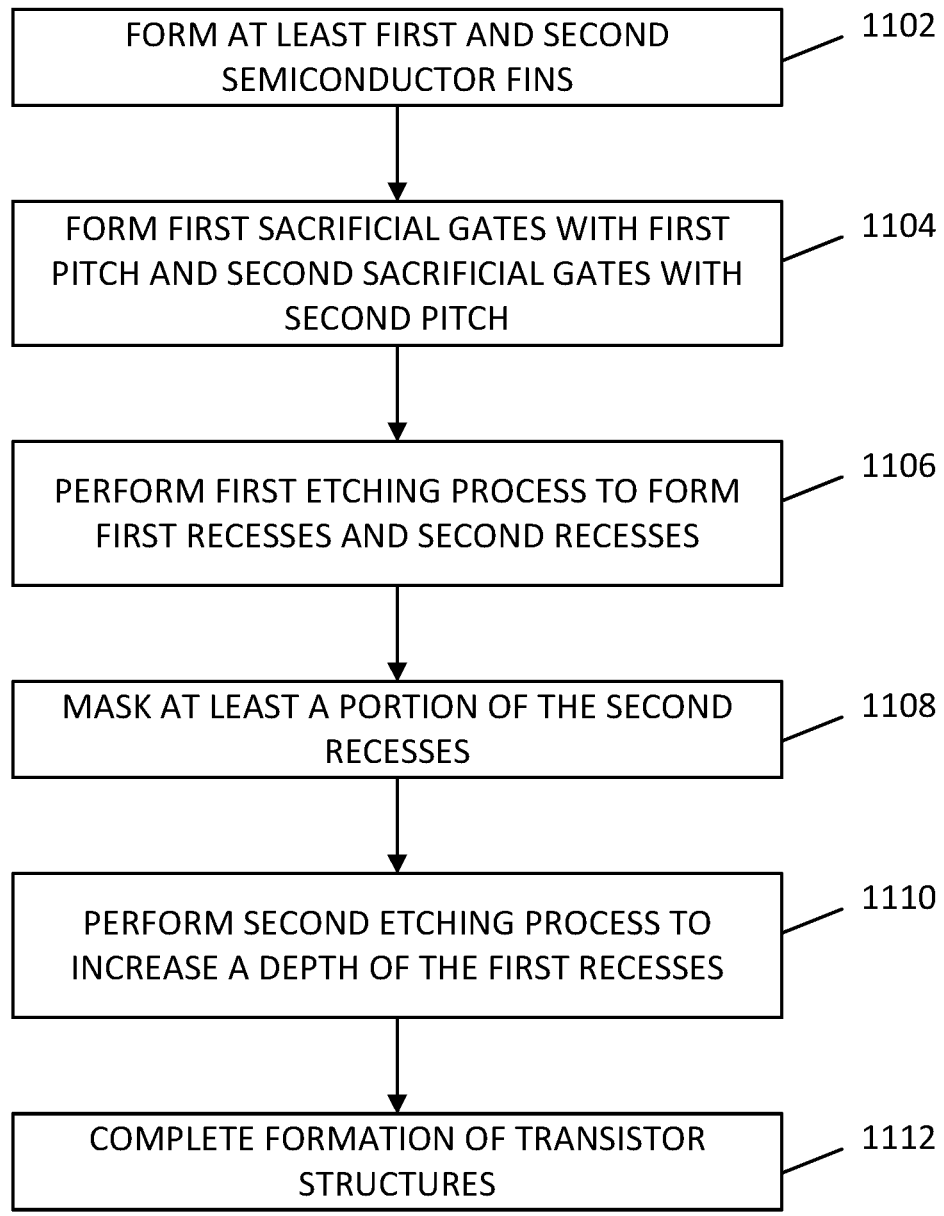
FIG. 11 is a flowchart of a fabrication process for semiconductor devices having different pitches, in accordance with an embodiment of the present disclosure.

FIG. 11 is a flow chart of a method 1100 for forming at least a portion of an integrated circuit, according to an embodiment. Various operations of method 1100 may be illustrated in FIGS. 2A-9A and 2B-9B. However, the correlation of the various operations of method 1100 to the specific components illustrated in the aforementioned figures is not intended to imply any structural and/or use limitations. Rather, the aforementioned figures provide one example embodiment of method 1100. Other operations may be performed before, during, or after any of the operations of method 1100. Some of the operations of method 1100 may be performed in a different order than the illustrated order.

Method 1100 begins with operation 1102 where at least first and second semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around process can then be carried out. Again, the alternating layers can be blanket deposited and then etched into fins, or deposited into fin-shaped trenches.

Method 1100 continues with operation 1104 where sacrificial gates and spacer structures are formed over a portion of the fins. The sacrificial gates may include any material that can be safely removed later in the process without etching or otherwise damaging the spacer structures and/or the fins. The sacrificial gates may include polysilicon while the spacer structures may include silicon nitride. The spacer structures are formed on sidewalls of the sacrificial gates and etched back to remove the spacer structure material from any horizontal surfaces.

According to some embodiments, at least a first set of sacrificial gates have a first pitch between them and at least a second set of sacrificial gates have a second pitch between them different from the first pitch. The difference in the pitches may be between about 3 nm and about 5 nm, between about 5 nm and about 10 nm, or between about 10 nm and about 15 nm. In one example, the first pitch is around 45 nm and the second pitch is around 50 nm. In some examples, the first pitch is between about 40 nm and about 50 nm and the second pitch is between about 45 nm and about 55 nm. The distance between adjacent sacrificial gates (and corresponding spacer structures) determines a width of a diffusion region between the adjacent sacrificial gates.

Method 1100 continues with operation 1106 where a first etching processes is performed to form one or more first recesses in the areas between the sacrificial gates having a first pitch and one or more second recesses in the areas between the sacrificial gates having a second pitch. The first and second recesses may be etched through the exposed fin between adjacent sacrificial gates and sidewall spacers using RIE. According to some embodiments, the first and second recesses also extend into a portion of the substrate beneath the fins. According to some embodiments, the one or more second recesses are deeper compared to the one or more first recesses due to loading effects.

Method 1100 continues with operation 1108 where at least a portion of the one or more second recesses are masked by forming a mask material over them. According to some embodiments, the mask material, such as CHM, is formed to protect the one or more second recesses from further etching. However, an edge of the mask material may be aligned within one of the second recesses, such that only a portion of the second recess includes the mask material. In some other embodiments, the mask material is aligned such that it protects the entirety of each of the one or more second recesses.

Method 1100 continues with operation 1110 where a second etching process is performed to increase the depth of the one or more first recesses. The second etching process may also use RIE. The mask material protects at least a portion of or all of the one or more second recesses during the second etching process, according to some embodiments. The depth of the one or more first recesses may be increased until it is close to a depth of the one or more second recesses (e.g., within 2 nm, within 1 nm, or within 5 angstroms). Since the one or more first recesses are subjected to more etching processes compared to the one or more second recesses, the lower sidewalls of the one or more second recesses may exhibit higher etch damage (e.g., higher roughness) compared to the lower sidewalls of the one or more first recesses.

Method 1100 continues with operation 1112 where the transistor devices are completed. For example, source or drain regions are formed within the one or more first recesses and one or more second recesses. The source or drain regions may be epitaxially grown from the exposed ends of semiconductor layers from adjacent fins, such that the material grows together towards the middle of the recesses. In the example of PMOS devices, the source or drain regions may be a semiconductor material (e.g., group IV or group III-V semiconductor materials) having a higher dopant concentration of p-type dopants compared to n-type dopants. In the example of NMOS devices, the source or drain regions may be a semiconductor material (e.g., group IV or group III-V semiconductor materials) having a higher dopant concentration of n-type dopants compared to p-type dopants.

Additionally, the sacrificial gates are removed and replaced with gate structures over suspended nanoribbons, nanowires, or nanosheets of the various semiconductor devices. The gate structures may each include both a gate dielectric and a gate layer. The gate dielectric is first formed over the suspended nanoribbons, nanowires, or nanosheets followed by forming the gate layer within the remainder of the trench between the spacer structures, according to some embodiments. The gate dielectric may include any number of dielectric layers deposited using a CVD process, such as ALD. The gate layer can include any conductive material, such as a metal, metal alloy, or polysilicon. The gate layer may be deposited using electroplating, electroless plating, CVD, ALD, PECVD, or PVD, to name a few examples.

Example System

Figure 12:
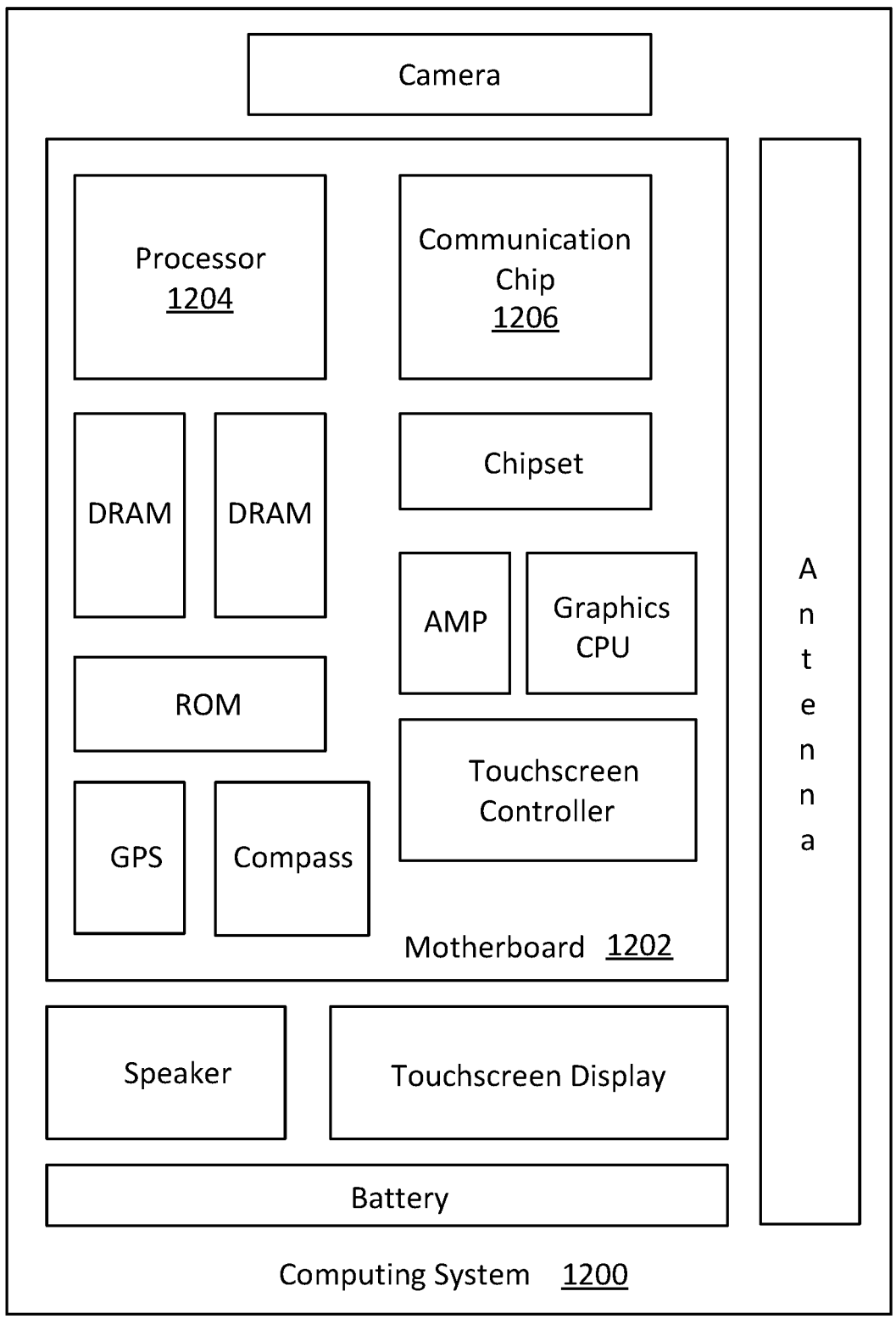
FIG. 12 illustrates a computing system including one or more integrated circuits, as variously described herein, in accordance with an embodiment of the present disclosure.

FIG. 12 is an example computing system implemented with one or more of the integrated circuit structures as disclosed herein, in accordance with some embodiments of the present disclosure. As can be seen, the computing system 1200 houses a motherboard 1202. The motherboard 1202 may include a number of components, including, but not limited to, a processor 1204 and at least one communication chip 1206, each of which can be physically and electrically coupled to the motherboard 1202, or otherwise integrated therein. As will be appreciated, the motherboard 1202 may be, for example, any printed circuit board (PCB), whether a main board, a daughterboard mounted on a main board, or the only board of system 1200, etc.

Depending on its applications, computing system 1200 may include one or more other components that may or may not be physically and electrically coupled to the motherboard 1202. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1200 may include one or more integrated circuit structures or devices configured in accordance with an example embodiment (e.g., a module including an integrated circuit device on a substrate, the substrate having one or more semiconductor devices with different pitches, as variously provided herein). In some embodiments, multiple functions can be integrated into one or more chips (e.g., for instance, note that the communication chip 1206 can be part of or otherwise integrated into the processor 1204).

The communication chip 1206 enables wireless communications for the transfer of data to and from the computing system 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1206 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1200 may include a plurality of communication chips 1206. For instance, a first communication chip 1206 may be dedicated to shorter range wireless communications such as Wi-Fi and Bluetooth and a second communication chip 1206 may be dedicated to longer range wireless communications such as GPS, EDGE, GPRS, CDMA, WiMAX, LTE, Ev-DO, and others.

The processor 1204 of the computing system 1200 includes an integrated circuit die packaged within the processor 1204. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1206 also may include an integrated circuit die packaged within the communication chip 1206. In accordance with some such example embodiments, the integrated circuit die of the communication chip includes one or more semiconductor devices as variously described herein. As will be appreciated in light of this disclosure, note that multi-standard wireless capability may be integrated directly into the processor 1204 (e.g., where functionality of any chips 1206 is integrated into processor 1204, rather than having separate communication chips). Further note that processor 1204 may be a chip set having such wireless capability. In short, any number of processor 1204 and/or communication chips 1206 can be used. Likewise, any one chip or chip set can have multiple functions integrated therein.

In various implementations, the computing system 1200 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1200 may be combined or integrated in a system-on-a-chip (SoC) architecture. In some embodiments, the components may be hardware components, firmware components, software components or any suitable combination of hardware, firmware or software.

FURTHER EXAMPLE EMBODIMENTS

The following examples pertain to further embodiments, from which numerous permutations and configurations will be apparent.

Example 1 is an integrated circuit that includes a semiconductor device having one or more semiconductor regions extending in a first direction between a first source or drain region and a second source or drain region, and a gate layer comprising a conductive material, the gate layer extending over the one or more semiconductor regions. The first source or drain region is part of a first diffusion region having a first width in the first direction and the second source or drain region is part of a second diffusion region having a second width in the first direction that is greater than the first width. The second diffusion region has a bottom surface with a step profile beneath the second source or drain region.

Example 2 includes the subject matter of Example 1, wherein the one or more semiconductor regions includes a fin that comprises silicon.

Example 3 includes the subject matter of Example 1 or 2, wherein the one or more semiconductor regions comprise a plurality of semiconductor nanoribbons.

Example 4 includes the subject matter of Example 3, wherein the plurality of semiconductor nanoribbons comprise germanium, silicon, or a combination thereof.

Example 5 includes the subject matter of any one of Examples 1-4, wherein a lower portion of the bottom surface of the second diffusion region has a first depth and an upper portion of the bottom surface of the second diffusion region has a second depth, the second depth of the second diffusion region being within 2 nm of a depth of the first diffusion region, and the first depth of the second diffusion region being more than 3 nm deeper than the depth of the first diffusion region.

Example 6 includes the subject matter of any one of Examples 1-5, wherein: the first diffusion region has a bottom surface with a stepless profile that extends to a first depth; and an upper portion of the step profile of the second diffusion region has a second depth within 2 nm of the first depth of the first diffusion region, and a lower portion of the step profile of the second diffusion region has a third depth that extends 3 or more nm deeper than the first depth.

Example 7 includes the subject matter of any one of Examples 1-5, wherein an upper portion of the step profile has a depth within 2 nm of a depth of the first diffusion region, and a lower portion of that step profile extends deeper than the depth of the first diffusion region.

Example 8 includes the subject matter of any one of Examples 1-7, further comprising a first plurality of semiconductor devices having a first plurality of semiconductor regions extending in the first direction between first source regions and first drain regions, the first source regions and first drain regions being a part of third diffusion regions, and a second plurality of semiconductor devices having a second plurality of semiconductor regions extending in the first direction between second source regions and second drain regions, the second source regions and second drain regions being a part of fourth diffusion regions, wherein a depth of the third diffusion regions is within 2 nm of a depth of the fourth diffusion regions.

Example 9 includes the subject matter of any one of Examples 1-8, wherein the first source or drain region and the second source or drain region comprise silicon and germanium.

Example 10 includes the subject matter of any one of Examples 1-9, wherein the first width is between about 40 nm and about 50 nm and the second width is between about 45 nm and about 55 nm.

Example 11 is a printed circuit board comprising the integrated circuit of any one of Examples 1-10.

Example 12 is an electronic device that includes a chip package having one or more dies. At least one of the one or more dies includes a semiconductor device having one or more semiconductor regions extending in a first direction between a first source or drain region and a second source or drain region, and a gate layer comprising a conductive material, the gate layer extending over the one or more semiconductor regions. The first source or drain region is part of a first diffusion region having a first width in the first direction and the second source or drain region is part of a second diffusion region having a second width in the first direction that is greater than the first width. The second diffusion region has a bottom surface with a step profile beneath the second source or drain region.

Example 13 includes the subject matter of Example 12, wherein the one or more semiconductor regions includes a fin that comprises silicon.

Example 14 includes the subject matter of Example 12 or 13, wherein the one or more semiconductor regions comprise a plurality of semiconductor nanoribbons.

Example 15 includes the subject matter of Example 14, wherein the plurality of semiconductor nanoribbons comprise germanium, silicon, or a combination thereof.

Example 16 includes the subject matter of any one of Examples 12-15, wherein a first portion of the bottom surface of the second diffusion region is about the same depth as a depth of the first diffusion region and a second portion of the bottom surface of the second diffusion is deeper than the depth of the first diffusion region.

Example 17 includes the subject matter of Example 16, wherein the first portion of the bottom surface of the second diffusion region has a depth within 2 nm of the depth of the first diffusion region.

Example 18 includes the subject matter of Example 16 or 17, wherein the second portion of the bottom surface of the second diffusion has a depth that is between 3 nm and 10 nm greater than the depth of the first portion of the bottom surface of the second diffusion region.

Example 19 includes the subject matter of any one of Examples 12-18, wherein the at least one of the one or more dies comprises a first plurality of semiconductor devices having a first plurality of semiconductor regions extending in the first direction between first source regions and first drain regions, the first source regions and first drain regions being a part of third diffusion regions, and a second plurality of semiconductor devices having a second plurality of semiconductor regions extending in the first direction between second source regions and second drain regions, the second source regions and second drain regions being a part of fourth diffusion regions, wherein a depth of the third diffusion regions is within 2 nm of a depth of the fourth diffusion regions.

Example 20 includes the subject matter of any one of Examples 12-19, wherein the first source or drain region and the second source or drain region comprise silicon and germanium.

Example 21 includes the subject matter of any one of Examples 12-20, wherein the first width is between about 40 nm and about 50 nm and the second width is between about 45 nm and about 55 nm.

Example 22 includes the subject matter of any one of Examples 12-21, further comprising a printed circuit board, wherein the chip package is attached to the printed circuit board.

Example 23 is a method of forming an integrated circuit. The method includes forming a plurality of fins comprising semiconductor material, wherein the plurality of fins extend parallel to one another in a first direction; forming a first plurality of sacrificial gate structures and a second plurality of sacrificial gate structures extending over the plurality of fins in a second direction different from the first direction, the first plurality of sacrificial gate structures having a first pitch between adjacent sacrificial gate structures and the second plurality of sacrificial gate structures having a second pitch between adjacent sacrificial gate structures, the second pitch being greater than the first pitch; performing a first etching process through a portion of the plurality of fins to form first recesses between the first plurality of sacrificial gate structures and to form second recesses between the second plurality of sacrificial gate structures; masking at least a portion of the second recesses; and performing a second etching process to increase a depth of the first recesses between the first plurality of sacrificial gate structures.

Example 24 includes the subject matter of Example 23, wherein the masking comprises masking only a portion of one of the second recesses.

Example 25 includes the subject matter of Example 24, wherein performing the second etching process comprises etching an unmasked portion of the one of the second recesses.

Example 26 includes the subject matter of any one of Examples 23-25, further comprising epitaxially growing first source or drain regions within the first recesses and second source or drain regions within the second recesses.

Example 27 includes the subject matter of any one of Examples 23-26, wherein performing the first etching process comprises etching the first recesses to a first depth and etching the second recesses to a second depth, wherein the second depth is greater than the first depth.

Example 28 is an integrated circuit that includes one or more first semiconductor devices having one or more first semiconductor regions extending in a first direction between first source or drain regions, and one or more second semiconductor devices having one or more second semiconductor regions extending in the first direction between second source or drain regions. The first source or drain regions are part of first diffusion regions that have a first width in the first direction and a first depth extending beneath the first source or drain regions. The second source or drain regions are part of second diffusion regions that have a second width in the first direction that is greater than the first width and a second depth extending beneath the second source or drain regions, the second depth being within 2 nm of the first depth.

Example 29 includes the subject matter of Example 28, wherein the one or more first and second semiconductor regions include fins that comprise silicon.

Example 30 includes the subject matter of Example 28 or 29, wherein the one or more first and second semiconductor regions comprise a plurality of semiconductor nanoribbons.

Example 31 includes the subject matter of Example 30, wherein the plurality of semiconductor nanoribbons comprise germanium, silicon, or a combination thereof.

Example 32 includes the subject matter of any one of Examples 28-31, wherein the first source or drain regions and the second source or drain regions comprise silicon and germanium.

Example 33 includes the subject matter of any one of Examples 28-32, wherein the first width is between about 40 nm and about 50 nm and the second width is between about 45 nm and about 55 nm.

Example 34 includes the subject matter of any one of Examples 28-33, wherein the one or more first semiconductor regions are colinear with the one or more second semiconductor regions.

Example 35 includes the subject matter of any one of Examples 28-34, wherein the second depth is within 1 nm of the first depth.

Example 36 includes the subject matter of any one of Examples 28-35, wherein the second depth is within 5 angstroms of the first depth.

Example 37 is a printed circuit board comprising the integrated circuit of any one of Examples 28-36.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:
1. An integrated circuit comprising:
  a semiconductor device having one or more semiconductor regions extending in a first direction between a first source or drain region and a second source or drain region; and a gate structure comprising a conductive material, the gate structure extending over the one or more semiconductor regions;

wherein the first source or drain region is part of a first diffusion region, the first diffusion region having a first width in the first direction, and the second source or drain region is part of a second diffusion region, the second diffusion region having a second width in the first direction that is greater than the first width, and wherein the second diffusion region has a bottom surface with a step profile beneath the second source or drain region.

2. The integrated circuit of claim 1, wherein the one or more semiconductor regions comprise a plurality of semiconductor nanoribbons.

3. The integrated circuit of claim 1, wherein a lower portion of the bottom surface of the second diffusion region has a first depth and an upper portion of the bottom surface of the second diffusion region has a second depth, the second depth of the second diffusion region being within 2 nm of a depth of the first diffusion region, and the first depth of the second diffusion region being more than 3 nm deeper than the depth of the first diffusion region.

4. The integrated circuit of claim 1, wherein an upper portion of the step profile has a depth within 2 nm of a depth of the first diffusion region, and a lower portion of that step profile extends deeper than the depth of the first diffusion region.

5. The integrated circuit of claim 1, further comprising a first plurality of semiconductor devices having a first plurality of semiconductor regions extending in the first direction between first source regions and first drain regions, the first source regions and first drain regions being a part of third diffusion regions, and a second plurality of semiconductor devices having a second plurality of semiconductor regions extending in the first direction between second source regions and second drain regions, the second source regions and second drain regions being a part of fourth diffusion regions, wherein a depth of the third diffusion regions is within 2 nm of a depth of the fourth diffusion regions.

6. The integrated circuit of claim 1, wherein the first width is between about 40 nm and about 50 nm and the second width is between about 45 nm and about 55 nm.

7. A printed circuit board comprising the integrated circuit of claim 1.

8. An electronic device, comprising:
a chip package comprising one or more dies, at least one of the one or more dies comprising
a semiconductor device having one or more semiconductor regions extending in a first direction between a first source or drain region and a second source or drain region; and
a gate structure comprising a conductive material, the gate structure extending over the one or more semiconductor regions;
wherein the first source or drain region is part of a first diffusion region, the first diffusion region having a first width in the first direction, and the second source or drain region is part of a second diffusion region, the second diffusion region having a second width in the first direction that is greater than the first width, and wherein the second diffusion region has a bottom surface with a step profile beneath the second source or drain region.

9. The electronic device of claim 8, wherein the one or more semiconductor regions comprise a plurality of semiconductor nanoribbons.

10. The electronic device of claim 8, wherein a first portion of the bottom surface of the second diffusion region is about the same depth as a depth of the first diffusion region and a second portion of the bottom surface of the second diffusion is deeper than the depth of the first diffusion region.

11. The electronic device of claim 10, wherein the first portion of the bottom surface of the second diffusion region has a depth within 2 nm of the depth of the first diffusion region, and the second portion of the bottom surface of the second diffusion region has a depth that is between 3 nm and 10 nm greater than the depth of the first portion of the bottom surface of the second diffusion region.

12. The electronic device of claim 8, wherein the at least one of the one or more dies comprises a first plurality of semiconductor devices having a first plurality of semiconductor regions extending in the first direction between first source regions and first drain regions, the first source regions and first drain regions being a part of third diffusion regions, and a second plurality of semiconductor devices having a second plurality of semiconductor regions extending in the first direction between second source regions and second drain regions, the second source regions and second drain regions being a part of fourth diffusion regions, wherein a depth of the third diffusion regions is within 2 nm of a depth of the fourth diffusion regions.

13. The electronic device of claim 8, wherein the first width is between about 40 nm and about 50 nm and the second width is between about 45 nm and about 55 nm.

14. An integrated circuit comprising:
one or more first semiconductor devices having one or more first semiconductor regions extending in a first direction between first source or drain regions that have a first width in the first direction;
one or more second semiconductor devices having one or more second semiconductor regions extending in the first direction between second source or drain regions that have a second width in the first direction that is greater than the first width; and
a dielectric layer contacting a bottom surface of the second source or drain regions, wherein the dielectric layer has a step profile beneath the second source or drain regions.

15. The integrated circuit of claim 14, wherein the one or more first and second semiconductor regions comprise a plurality of semiconductor nanoribbons.

16. The integrated circuit of claim 14, wherein the first source or drain regions and the second source or drain regions comprise silicon and germanium.

17. The integrated circuit of claim 14, wherein the first width is between about 40 nm and about 50 nm and the second width is between about 45 nm and about 55 nm.

18. The integrated circuit of claim 14, wherein the one or more first semiconductor regions are colinear with the one or more second semiconductor regions.

19. The integrated circuit of claim 14, wherein the dielectric layer is a first dielectric layer and the integrated circuit further comprises a second dielectric layer contacting a bottom surface of the first source or drain regions, wherein the second dielectric layer does not have a step profile beneath the first source or drain regions.

20. A printed circuit board comprising the integrated circuit of claim 14.

* * * * *